US012648062B2

(12) United States Patent
Hwang et al.

(10) Patent No.: US 12,648,062 B2
(45) Date of Patent: Jun. 2, 2026

(54) PULSE WIDTH MODULATION SIGNAL GENERATION CIRCUIT AND LAMP CONTROL SYSTEM INCLUDING THE SAME

(71) Applicant: LX SEMICON CO., LTD., Daejeon (KR)

(72) Inventors: Won Joon Hwang, Daejeon (KR); Ji Seok Kim, Daejeon (KR); Hai Feng Jin, Daejeon (KR); Ju Pyo Hong, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 23 days.

(21) Appl. No.: 18/535,110

(22) Filed: Dec. 11, 2023

(65) Prior Publication Data

US 2024/0196494 A1     Jun. 13, 2024

(30) Foreign Application Priority Data

Dec. 13, 2022   (KR) ........................ 10-2022-0173356
Sep. 7, 2023   (KR) ........................ 10-2023-0118793

(51) Int. Cl.
   *H05B 45/325*   (2020.01)
   *H03K 3/0233*   (2006.01)
   (Continued)

(52) U.S. Cl.
   CPC ......... *H05B 45/325* (2020.01); *H03K 3/0233* (2013.01); *H03K 5/04* (2013.01); *H03K 7/08* (2013.01)

(58) Field of Classification Search
   CPC . H03K 5/04; H03K 7/08; H03K 3/017; H05B 45/325
   See application file for complete search history.

(56) References Cited

U.S. PATENT DOCUMENTS 8,558,497 B2   10/2013   Wright
8,922,290 B2   12/2014   Liu et al.
                  (Continued)

FOREIGN PATENT DOCUMENTS

CN        101316114 B      3/2012

OTHER PUBLICATIONS

Extended European Search Report issued for European Application No. 23215985.5 on Oct. 8, 2024, 23 pages.
(Continued)

*Primary Examiner* — Patrick C Chen
(74) *Attorney, Agent, or Firm* — ROTHWELL, FIGG, ERNST & MANBECK, P.C.

(57)       ABSTRACT

Disclosed are a pulse width modulation (PWM) signal generation circuit and a lamp control system including the same. The PWM signal generation circuit includes a pulse period control circuit configured to control charging and discharging of a first capacitor, and generate a first output signal related to a first number of times of charging of the first capacitor, a pulse width control circuit configured to control charging and discharging of a second capacitor, and generate a second output signal related to a second number of times of charging of the second capacitor, and a control logic circuit configured to determine a period of a PWM signal based on the first output signal, determine a pulse width of the PWM signal based on the second output signal, and output the PWM signal having the period and the pulse width.

8 Claims, 11 Drawing Sheets

(51) Int. Cl.
H03K 5/04 (2006.01)
H03K 7/08 (2006.01)

(56) References Cited

U.S. PATENT DOCUMENTS

| | | | | |
|---|---|---|---|---|
| 9,419,600 B2 * | 8/2016 | Fujiwara | .............. | H05B 45/325 |
| 2012/0235571 A1 | 9/2012 | Cheng et al. | | |
| 2013/0027151 A1 * | 1/2013 | Liu | ......................... | H03K 7/08 |
| | | | | 332/109 |
| 2013/0076417 A1 | 3/2013 | Kris | | |

OTHER PUBLICATIONS

Partial European Search Report dated May 31, 2024 issued for the European Patent Application No. 23215985.5, 19 pages.

* cited by examiner

If all bits of CNT1 are High, Then OUT1 = L
If all bits of CNT2 are High, Then OUT2 = L If CNT1_MSB is Hight, Then OUT1 = L
If CNT2_MSB is Hight, Then OUT2 = L

240/270

242/272

244d/274d

CMP1/CMP2 —————→ Counter ——— CNT1_MSB/CNT2_MSB ———▷∘—→ OUT1/OUT2

↑

RST

PULSE WIDTH MODULATION SIGNAL GENERATION CIRCUIT AND LAMP CONTROL SYSTEM INCLUDING THE SAME

CROSS-REFERENCE TO RELATED APPLICATION

This application claims the benefit of Korean Patent Application Nos. 10-2022-0173356 filed on Dec. 13, 2022, and 10-2023-0118793 filed on Sep. 7, 2023, all of which are hereby incorporated by reference in their entirety as if fully set forth herein.

BACKGROUND OF THE DISCLOSURE

Technical Field

The present disclosure relates to a circuit for generating a pulse width modulation (PWM) signal.

Background

Pulse width modulation (PWM) is a method of modulating a pulse wave by adjusting the pulse width of the pulse wave. Sometimes, PWM is also referred to as pulse-duration modulation (PDM).

PWM control is a pulse control method that modulates the pulse width, frequency, or both at each period to induce a defined output waveform.

PWM can vary the average voltage by varying the pulse width by adjusting the duty ratio of the pulse wave. By varying the pulse width in digital form, the amplitude of the analog output can be controlled.

The duty ratio, also called duty or duty cycle, represents the proportion of a signal with a high level (or a signal that is turned on) in the carrier period of a PWM signal.

The average output voltage depends on the duty ratio. A PWM signal represented by the repetition of a pulse wave has the same effect as outputting an average DC voltage.

The use of PWM signals is increasing in various fields because outputting analog output signals using the PWM method makes it possible to control the brightness of light-emitting diodes (LEDs), create various colors using RGB LEDs, or control the rotational speed of DC motors.

To generate PWM signals as described above, a PWM signal generation circuit is used. A general PWM signal generation circuit generates PWM signals by changing the charge and discharge time using resistors and capacitors outside the chip configured to generate PWM signals. However, when a charged capacitor is discharged using a resistor, there is a limitation that it is difficult to secure linear characteristics, and the resistor or capacitor affects the duty according to the change in temperature.

SUMMARY

An object of the present disclosure devised to solve the above-mentioned problems is to provide a pulse width modulation signal generation circuit capable of generating a PWM signal whose duty ratio remains constant even when the ambient temperature changes, and a lamp control system including the same.

Another object of the present disclosure is to provide a PWM signal generation circuit capable of improving a nonlinearity of a discharge voltage affecting a PWM signal, and a lamp control system including the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a pulse width modulation (PWM) signal generation circuit may include a pulse period control circuit configured to control charging and discharging of a first capacitor, and generate a first output signal related to a first number of times of charging of the first capacitor, a pulse width control circuit configured to control charging and discharging of a second capacitor, and generate a second output signal related to a second number of times of charging of the second capacitor, and a control logic circuit configured to determine a period of a PWM signal based on the first output signal, determine a pulse width of the PWM signal based on the second output signal, and output the PWM signal having the period and the pulse width.

In another aspect of the present disclosure, a lamp control system may include a lamp, resistors, and a lamp driving circuit connected to the resistors to drive the lamp, wherein the lamp driving circuit may include a switch configured to supply a driving signal for driving of the lamp to the lamp in response to a control signal, a PWM signal generation circuit configured to generate the PWM signal, and a current control circuit configured to generate the control signal in response to the PWM signal, wherein the PWM signal generation circuit is configured to determine a period of the PWM signal based on a first output signal related to a first number of times of charging of a first capacitor, determine a pulse width of the PWM signal based on a second output signal related to a second number of times of charging of a second capacitor, and generate the PWM signal having the period and the pulse width.

In another aspect of the present disclosure, a pulse width modulation (PWM) signal generation circuit may include a first voltage-to-current converter configured to convert a first voltage into a first current, a first oscillator configured to generate a first oscillation signal based on the first current, a second voltage-to-current converter configured to convert a second voltage to a second current, a second oscillator configured to generate a second oscillation signal based on the second current, and a control logic circuit configured to generate a PWM signal based on a timing of the first oscillation signal and a timing of the second oscillation signal.

BRIEF DESCRIPTION OF THE DRAWINGS

The accompanying drawings, which are included to provide a further understanding of the invention and are incorporated in and constitute a part of this application, illustrate embodiment(s) of the present disclosure and together with the description serve to explain the principle of the present disclosure. In the drawings.

DETAILED DESCRIPTION

Figure 1:
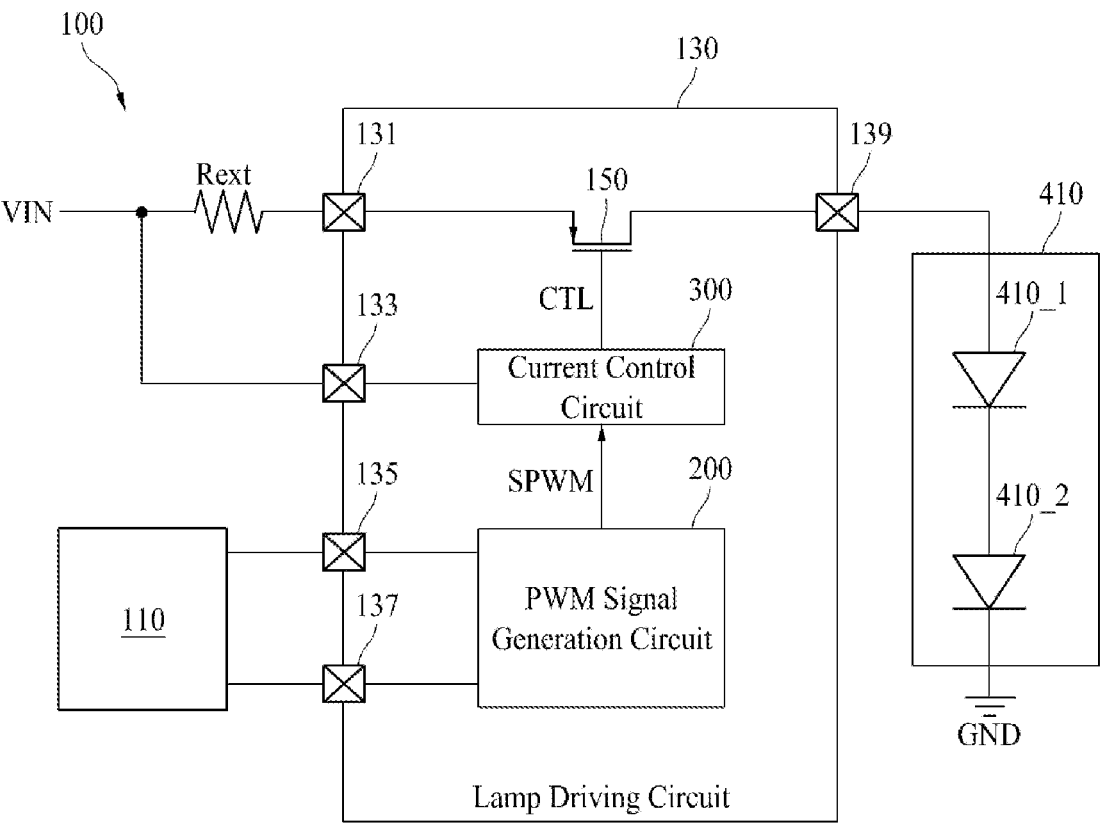
FIG. 1 is a block diagram of a lamp control system according to one embodiment of the present disclosure.

Throughout the specification, like reference numerals are used to refer to substantially the same components. In the following description, detailed descriptions of components and features known in the art may be omitted if they are not relevant to the core configuration of the present disclosure. The meanings of terms used in this specification are to be understood as follows.

The advantages and features of the present disclosure, and methods of achieving them, will become apparent from the detailed description of the embodiments, together with the accompanying drawings. However, the present disclosure is not limited to the embodiments disclosed herein and will be implemented in many different forms. The embodiments are provided merely to make the disclosure of the present invention thorough and to fully inform one of ordinary skill in the art to which the present disclosure belongs of the scope of the invention. It is to be noted that the scope of the present disclosure is defined only by the claims.

The figures, dimensions, ratios, angles, numbers of elements given in the drawings are merely illustrative and are not limiting. Like reference numerals refer to like elements throughout the specification. Further, in describing the present disclosure, descriptions of well-known technologies may be omitted in order to avoid obscuring the gist of the present disclosure.

As used herein, the terms "includes," "has," "comprises," and the like should not be construed as being restricted to the means listed thereafter unless specifically stated otherwise. As used herein, the singular forms "a", "an", and "the" are intended to include the plural forms as well, unless the context clearly indicates otherwise.

Elements are to be interpreted a margin of error, even if not explicitly stated otherwise.

For example, when a positional relationship between two parts is described using terms such as "on top of", "on", "under", "next to", etc., one or more other parts may be positioned between the two parts, unless "immediately" or "directly" is used.

In describing temporal relationships, terms such as "after," "subsequent to," "next to," "before," and the like may include cases where any two events are not consecutive, unless the term "immediately" or "directly" is explicitly used.

While the terms first, second, and the like are used to describe various elements, the elements are not limited by these terms. These terms are used merely to distinguish one element from another. Accordingly, a first element referred to herein may be a second element within the technical idea of the present disclosure.

It should be understood that the term "at least one" includes all possible combinations of one or more related items. For example, the phrase"at least one of the first, second, and third items" can mean each of the first, second, or third items, as well as any possible combination of two or more of the first, second, and third items.

Features of various embodiments of the present disclosure can be partially or fully combined. As will be clearly appreciated by those skilled in the art, various interactions and operations are technically possible. Embodiments can be practiced independently of each other or in conjunction with each other.

Hereinafter, embodiments of the present disclosure will be described in detail with reference to the accompanying drawings.

FIG. 1 is a block diagram of a lamp control system according to one embodiment of the present disclosure. Referring to FIG. 1, a lamp (or light) control system 100 includes a resistor Rext, a regulation circuit 110 including a plurality of resistors, a lamp driving circuit 130, and a lamp 410.

The lamp driving circuit 130 may be implemented as an integrated circuit (IC), a semiconductor chip, or a field-programmable gate array (FPGA).

The lamp driving circuit 130 includes a plurality of pins 131, 133, 135, 137, and 139, a switch circuit 150, a pulse width modulation (PWM) signal generation circuit 200, and a current control circuit 300. Each of the pins 131, 133, 135, 137, and 139 is a connection terminal and may be referred to as a pad.

An input voltage VIN is supplied to a first pin 131 via the resistor Rext. The input voltage VIN, which is used as the operating voltage for the current control circuit 300, is supplied to the current control circuit 300 via the second pin 133.

The regulation circuit 110, which includes a plurality of resistors, may be connected to the PWM signal generation circuit 200 via a plurality of pins 135 and 137 to regulate the current fed back within the PWM signal generation circuit 200. In particular, the regulation circuit 110 may regulate the current generated from first to fourth current supply circuits PT1 to PT4 and fed back to a first operational amplifier (OP amp) 210 or a second OP amp 250 in the PWM signal generation circuits 200-1, 200-2, and 200-3 shown in FIGS. 3, 6, and 8, which will be described later.

In one embodiment, the regulation circuit 110 may be positioned physically separated from the PWM signal generation circuit 200 to facilitate regulation of the current that is fed back.

The PWM signal generation circuit 200 may generate a PWM signal SPWM and output the same to a current control circuit 300, and the current control circuit 300 may generate a control signal CTL based on the PWM signal SPWM. The switch circuit 150 may be turned on or off in response to the control signal CTL.

For example, the switch circuit 150 may be turned on in response to the control signal CTL generated by the current control circuit 300 when the PWM signal SPWM is at a high level, and may be turned off in response to the control signal CTL generated by the current control circuit 300 when the PWM signal SPWM is at a low level.

The switch circuit 150 controls the connection between the first pin 131 and the fifth pin 139, and supplies, in response to the control signal CTL, a driving signal to the lamp 410 to drive the lamp 410. In one embodiment, the switch circuit 150 may be implemented as a PMOS transistor.

The lamp 410 is connected between the fifth pin 139 and ground GND and flashes (or turns on/off) in response to the on/off operation of the switch circuit 150. In one embodiment, the lamp 410 may include a plurality of LEDs 410_1 and 410_2 connected in series or parallel.

Figure 2:
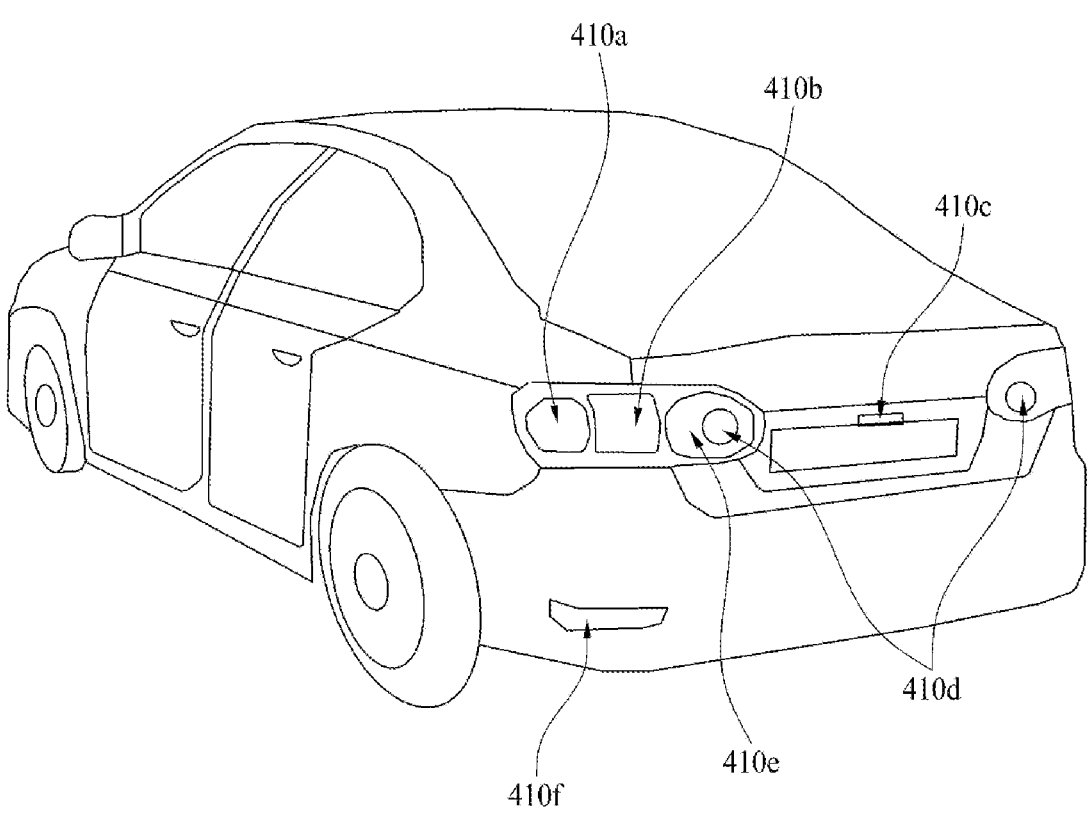
FIG. 2 is a diagram illustrating a vehicle rear lamp control system in which the lamp control system illustrated in FIG. 1 is used.

In one embodiment, the lamp control system 100 as described above may be included (or installed) in a vehicle as exemplarily shown in FIG. 2 to control the operation of a rear lamp of the vehicle.

That is, the lamp control system 100 of FIG. 1 may be used as a rear lamp control system of a vehicle. According to this embodiment, the lamp 410 may be a direction indicator or turn signal lamp 410a, a parking lamp 410b, a license plate lamp 410c, a reverse lamp 410d, a tail lamp or brake lamp 410e, or a rear fog lamp 410f, as shown in FIG. 2.

In the embodiment described above, the PWM signal generation circuit is described as being applied to the lamp control system 100 for simplicity of description. However, it should be noted that the PWM signal generation circuit 200 according to the present disclosure is applicable to any type of device in which a PWM signal is utilized.

Figure 3:
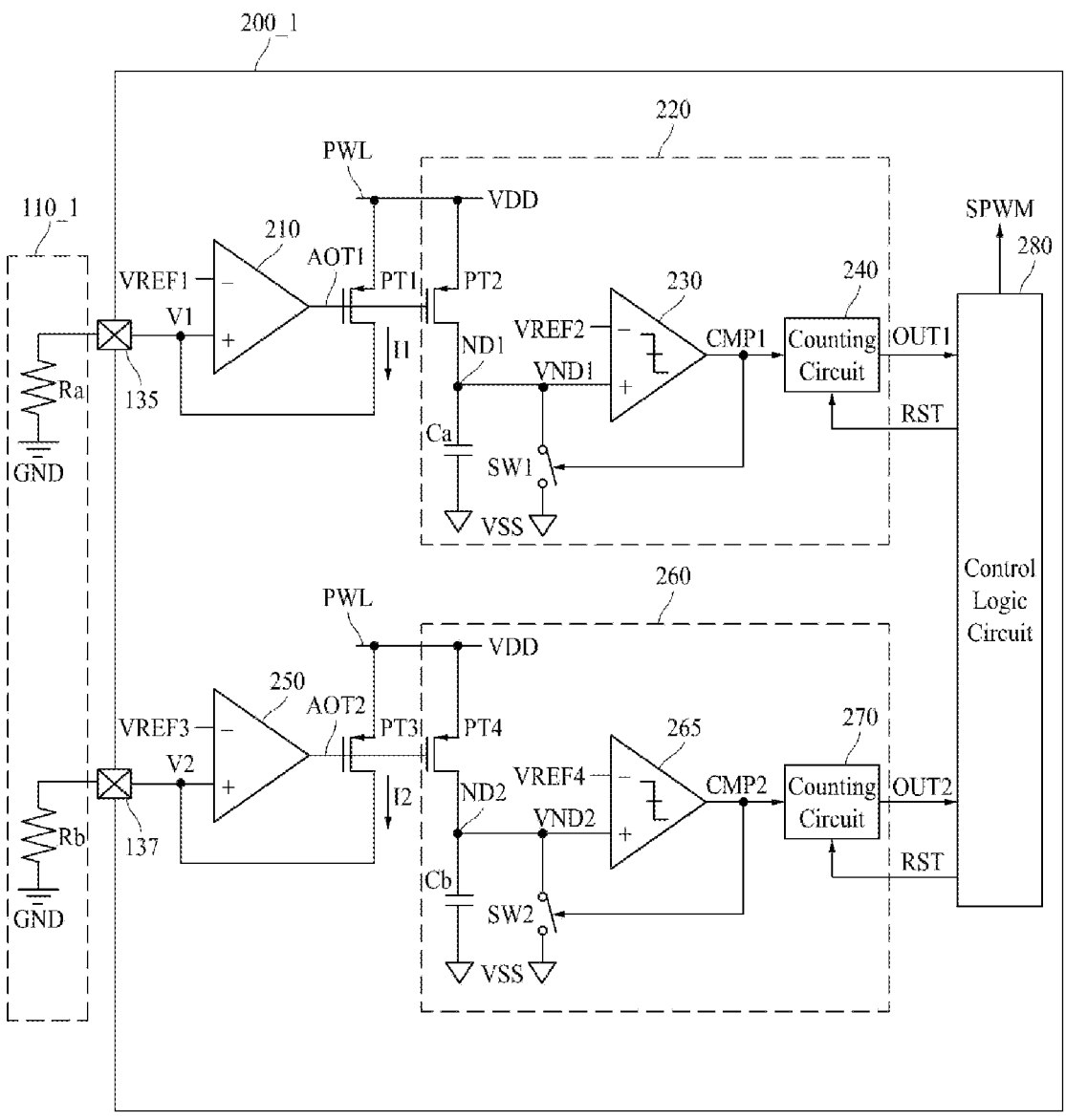
FIG. 3 is a block diagram of a PWM signal generation circuit according to one embodiment of the present disclosure.

FIG. 3 is a block diagram of a PWM signal generation circuit according to one embodiment of the present disclosure. A regulation circuit 110_1 and a PWM signal generation circuit 200-1 shown in FIG. 3 may be an example of the regulation circuit 110 and the PWM signal generation circuit 200 shown in FIG. 1, respectively.

For simplicity, FIG. 3 illustrates the regulation circuit 110_1 that includes a first resistor Ra and a second resistor Rb, and the PWM signal generation circuit 200_1 together.

The first resistor Ra is connected between a third pin 135 and the ground GND, and the second resistor Rb is connected between a fourth pin 137 and the ground GND. VSS is an internal ground of the PWM signal generation circuit 200_1, and GND is an external ground of the PWM signal generation circuit 200_1. VSS and GND may be connected to each other.

The PWM signal generation circuit 200_1 includes the third pin 135, the fourth pin 137, a first OP amp 210, a first current supply circuit PT1, a pulse period control circuit 220, a second OP amp 250, a second current supply circuit PT3, a pulse width control circuit 260, and a control logic circuit 280.

The first OP amp 210 is an example of the amplifier and generates a first charging control signal (or first amplification signal) AOT1 by amplifying the difference between a first reference voltage VREF1 and a voltage V1 of a non-inverting input terminal connected to the third pin 135.

The first current supply circuit PT1 supplies a first current I1 to the third pin 135 in response to the first charging control signal AOT1.

The pulse period control circuit 220 controls a charging operation for a first capacitor Ca using the first charging control signal AOT1, controls a discharging operation for the first capacitor Ca using a first discharging control signal CMP1, and generates a first output signal OUT1 related to the number of times the first capacitor Ca is charged, for example, the number of first charges. In other words, the pulse period control circuit 220 periodically performs charging and discharging operations for the first capacitor Ca according to the first charging control signal AOT1 and the first discharging control signal CMP1.

The pulse period control circuit 220 includes a first oscillator (or first oscillation circuit) and a first counting circuit 240, the first oscillator including the first capacitor Ca, a first charging control circuit PT2, a first comparison circuit 230, and a first discharging switch SW1.

The first charging control circuit PT2 supplies a charging current to the first capacitor Ca such that a charging operation is performed on the first capacitor Ca in response to the first charging control signal AOT1.

The first comparison circuit 230 compares a second reference voltage VREF2 with a first charging voltage VND1 of the first capacitor Ca, and generates the first discharging control signal CMP1 (which is also referred to as a first oscillation signal) that oscillates (e.g., periodically oscillates) according to the result of the comparison.

The first discharging switch SW1 controls the discharging operation for the first capacitor Ca in response to the first discharging control signal CMP1.

The first counting circuit 240 counts the number of changes in level (or changes in state) of the first discharging control signal CMP1, generates a first count value CNT1 corresponding to a first number of charges, and outputs a first output signal OUT1 having a first state (e.g., a first level or a low level L) when the first count value CNT1 reaches a first reference count value RCNT1. In this case, the second state may represent a high level.

The second OP amp 250, which is an example of the amplifier, generates a second charging control signal AOT2 (or second amplification signal) by amplifying the difference between a third reference voltage VREF3 and a voltage V2 to a non-inverting input terminal connected to the fourth pin 137.

The second current supply circuit PT3 supplies a second current I2 to the fourth pin 137 in response to the second charging control signal AOT2.

The pulse width control circuit 260 controls a charging operation for a second capacitor Cb using the second charging control signal AOT2, controls a discharging operation for the second capacitor Cb using a second discharging control signal CMP2, and generates a second output signal OUT2 related to the number of times the second capacitor Cb is charged, for example, a second number of charges. In other words, the pulse width control circuit 260 periodically performs charging and discharging operations on the second capacitor Cb according to the second charging control signal AOT2 and the second discharging control signal CMP2.

The pulse width control circuit 260 includes a second oscillator (or second oscillation circuit) and a second counting circuit 270, the second oscillator including a second capacitor Cb, a second charging control circuit PT4, a second comparison circuit 265, and a second discharging switch SW2.

The second charging control circuit PT4 supplies a charging current to the second capacitor Cb such that a charging operation is performed on the second capacitor Cb in response to the second charging control signal AOT2.

The second comparison circuit 265 compares a fourth reference voltage VREF4 with a second charging voltage VND2 of the second capacitor Cb, and generates the second discharging control signal CMP2 (which is also referred to as a second oscillation signal) that oscillates (e.g., periodically oscillates) according to the result of the comparison.

The second discharging switch SW2 controls the discharging operation for the second capacitor Cb in response to the second discharging control signal CMP2.

The second counting circuit 270 counts the number of changes in level (or changes in state) of the second discharging control signal CMP2, generates a second count value CNT2 corresponding to a second number of charges, and outputs a second output signal OUT2 having a first state (e.g., a low level L) when the second count value CNT2 reaches a second reference count value RCNT2. In this case, the second state may represent a high level.

Specific embodiments of the counting circuits 240 and 270 will be described below with reference to FIGS. 4A to 4D.

The control logic circuit 280 determines a period (e.g., T2 in FIG. 5 or FIG. 7) of a PWM signal SPWM based on the first output signal OUT1, determines a pulse width (e.g., T4 in FIG. 5 or FIG. 7) of the PWM signal SPWM based on the second output signal OUT2, and generates the PWM signal SPWM having the period T2 and pulse width T4.

In FIG. 3, the operating voltages for each of the components 210, 230, 250, and 265 are VDD and VSS.

In one embodiment, the first resistor Ra, the first OP amp 210, and the first current supply circuit PT1 in FIG. 3 may constitute a first voltage-to-current converter. Further, in FIG. 3, the second resistor Rb, the second OP amp 250, and the second current supply circuit PT3 may constitute a second voltage-to-current converter.

Here, a voltage-to-current converter refers to an electronic circuit that receives a voltage as an input and generates a current as an output. For example, an electronic circuit that generates a current proportional to an input voltage is referred to as a VI converter.

For example, the first voltage-to-current converter converts a first voltage V1 (or a voltage generated by the first resistor Ra) into a first current (e.g., I1), and the second voltage-to-current converter converts a second voltage V2 (or a voltage generated by the second resistor Rb) into a second current (e.g., I2).

Figure 5:
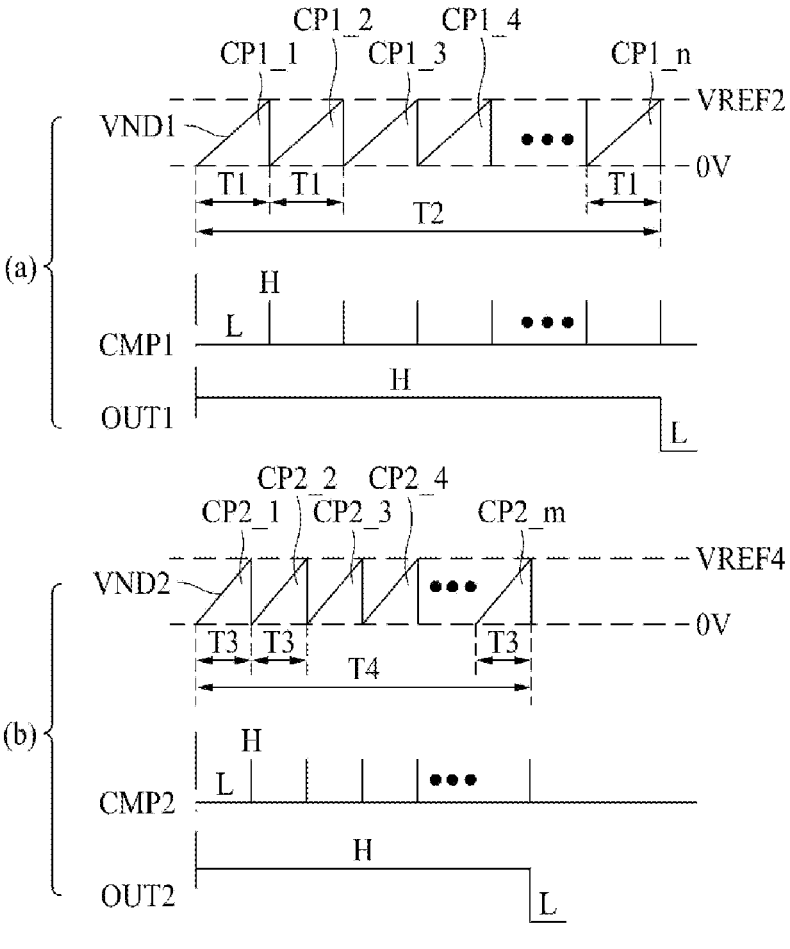
FIG. 5 is a timing diagram of signals illustrating the operation of the PWM signal generation circuit shown in FIG. 3.
Figure 5:
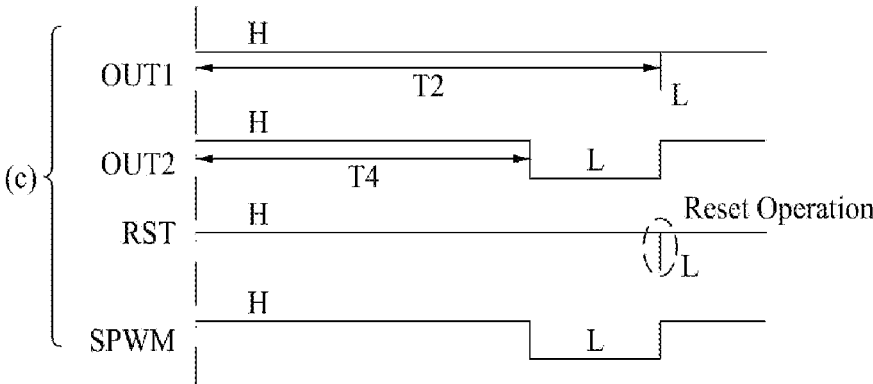
Figure 7:
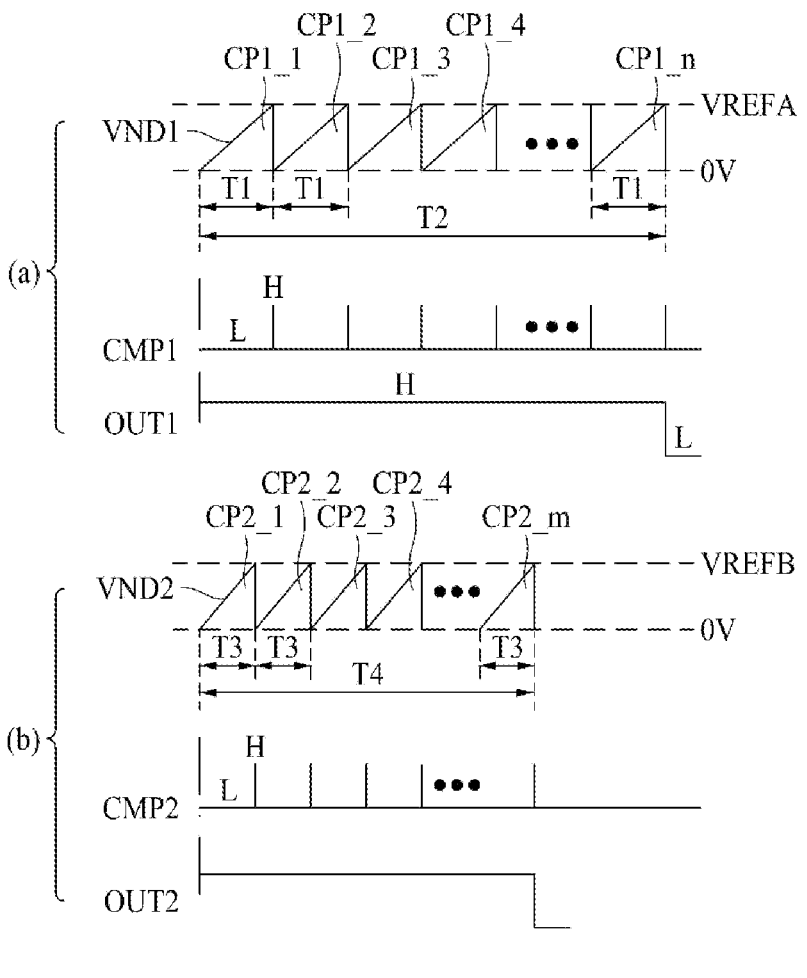
FIG. 7 is a timing diagram of signals illustrating the operation of the PWM signal generation circuit shown in FIG. 6.
Figure 7:
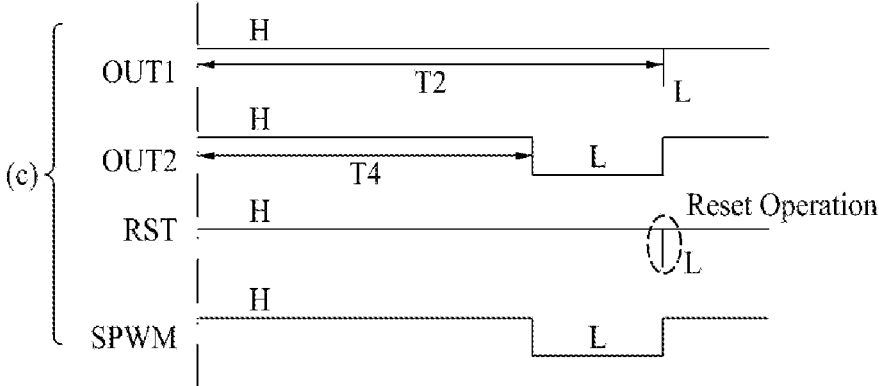

Thus, according to the present disclosure, a charging time interval T1 illustrated in FIG. 5-(a) or FIG. 7-(a) may be adjusted by regulating the first current I1 flowing in the first current supply circuit PT1 based on the first reference voltage VREF1 and the first resistor Ra using the first voltage-to-current converter. Furthermore, according to the present disclosure, a charging time interval T3 illustrated in FIG. 5-(b) or FIG. 7-(b) may be adjusted by regulating the second current I2 flowing in the second current supply circuit PT3 based on the third reference voltage VREF3 and the second resistor Rb using the second voltage-to-current converter.

In other words, depending on the respective reference voltages VREF1 and VREF3 and the resistances of the resistors Ra and Rb (or how they are designed), the amount of current of each current I1, I2 or the charging time for each capacitor Ca, Cb may be determined.

The first OP amp 210 includes an inverting input terminal configured to receive the first reference voltage VREF1, a non-inverting input terminal connected to the third pin 135, and an output terminal configured to output the first charging control signal AOT1. The first OP amp 210 amplifies the difference between the first reference voltage VREF1 and the voltage V1 at the non-inverting input terminal, and outputs the result (AOT1) to the gates of the first current supply circuit PT1 and the first charging control circuit PT2 via the output terminal. In this case, the first current supply circuit PT1 and the first charging control circuit PT2 may each be implemented as PMOS transistors. In one embodiment, the PMOS transistors PT1 and PT2 may have the same physical characteristics and electrical characteristics.

The first current I1 flowing in the first current supply circuit PT1 may be defined according to the first resistor Ra and the first reference voltage VREF1. When the voltage to the third pin 135, i.e., the voltage V1 to the non-inverting input terminal, is lower than the first reference voltage VREF1, the first OP amp 210 generates the first charging control signal AOT1 having a low level (L), and thus the PMOS transistors PT1 and PT2 remain on.

However, when the voltage to the third pin 135, i.e., the voltage V1 to the non-inverting input terminal, becomes greater than or equal to the first reference voltage VREF1, the first OP amp 210 generates the first charging control signal AOT1 having a high level (H), and thus each PMOS transistor PT1, PT2 is turned off. Accordingly, the pulse period control circuit 220 does not perform the charging operation.

The second OP amp 250 includes an inverting input terminal configured to receive the third reference voltage VREF3, a non-inverting input terminal connected to the fourth pin 137, and an output terminal configured to output the second charging control signal AOT2. The second OP amp 250 amplifies the difference between the third reference voltage VREF3 and the voltage V2 to the non-inverting input terminal, and outputs the result (AOT2) to the gates of the PMOS transistors PT3 and PT4 constituting the second current supply circuit PT3 and the second charging control circuit PT4, respectively, via the output terminal. In one embodiment, the PMOS transistors PT3 and PT4 may have the same physical characteristics and electrical characteristics.

The second current I2 flowing in the second current supply circuit PT3 may be defined according to the second resistor Rb and the third reference voltage VREF3. When the voltage to the fourth pin 137, i.e., the voltage V2 to the non-inverting input terminal, is lower than the third reference voltage VREF3, the second OP amp 250 generates the second charging control signal AOT2 having a low level (L), and thus the PMOS transistors PT3 and PT4 remain on.

However, when the voltage to the fourth pin 137, i.e., the voltage V2 to the non-inverting input terminal, becomes greater than or equal to the third reference voltage VREF3, the second OP amp 250 generates the second charging control signal AOT2 having a high level (H), and thus the PMOS transistors PT3 and PT4 are turned off. Accordingly, the pulse width control circuit 260 does not perform the charging operation.

The first current supply circuit PT1 and the second current supply circuit PT3 are also called pass transistors.

When the first current supply circuit PT1 is a PMOS transistor, the source is connected to a voltage line PWL which is used to supply the operating voltage VDD, the drain is connected to the non-inverting input terminal of the first OP amp 210, and the gate is connected to the output terminal of the first OP amp 210.

When the second current supply circuit PT3 is a PMOS transistor, the source is connected to a voltage line PWL which is used to supply the operating voltage VDD, the drain is connected to the non-inverting input terminal of the second OP amp 250, and the gate is connected to the output terminal of the second OP amp 250.

The first current I1 flows by the first current supply circuit PT1, and the second current I2 flows by the second current supply circuit PT3. Since the first current I1 is determined by the first resistor Ra and the first reference voltage VREF1, and the second current I2 is determined by the second resistor Rb and the third reference voltage VREF3, the first current (or first current amount) I1 and the second current (or second current amount) I2 may be the same or different from each other.

The first charging control circuit PT2 is connected between the voltage line PWL and a first node ND1, and the gate of the first charging control circuit PT2 is connected to the output terminal of the first OP amp 210.

The first capacitor Ca and the first discharging switch SW1 are each connected between the first node ND1 and the ground VSS.

The first comparison circuit 230 includes an inverting terminal configured to receive the second reference voltage VREF2, a non-inverting input terminal connected to the first node ND1, and an output terminal configured to output the first discharging control signal CMP1. The first discharging control signal CMP1 is output to the control terminal of the first discharging switch SW1 and the first counting circuit 240. When the first discharging switch SW1 is implemented as an NMOS transistor, the first discharging control signal CMP1 may be supplied to the gate of the NMOS transistor.

The first capacitor Ca may be an on-chip capacitor.

The second charging control circuit PT4 is connected between the voltage line PWL and a second node ND2, and the gate of the second charging control circuit PT4 is connected to the output terminal of the second OP amp 250.

The second capacitor Cb and the second discharging switch SW2 are each connected between the second node ND2 and the ground VSS.

The second comparison circuit 265 includes an inverting terminal configured to receive the fourth reference voltage VREF4, a non-inverting input terminal connected to the second node ND2, and an output terminal configured to output the second discharging control signal CMP2. The second discharging control signal CMP2 is output to the control terminal of the second discharging switch SW2 and the second counting circuit 270. When the second discharging switch SW2 is implemented as an NMOS transistor, the second discharging control signal CMP2 may be supplied to the gate of the NMOS transistor.

The second capacitor Cb may be an on-chip capacitor.

Figure 4A:
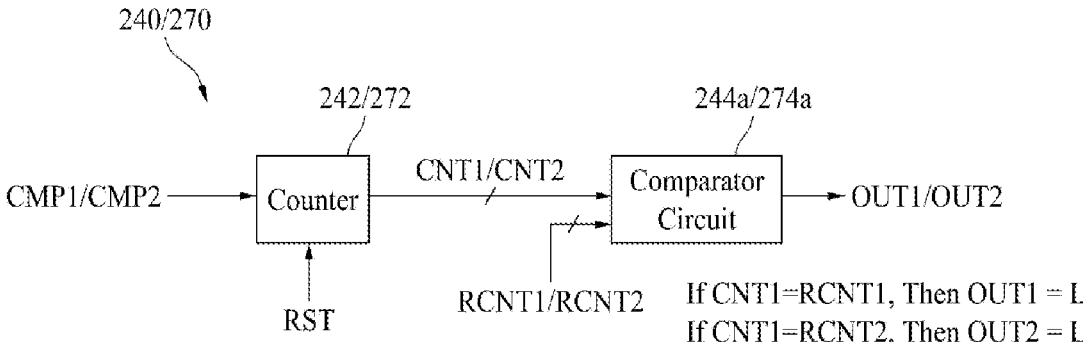
FIGS. 4A to 4D are block diagrams illustrating embodiments of the counting circuit shown in FIG. 3.

FIG. 4A is a block diagram according to one embodiment of the counting circuit shown in FIG. 3. The structure and operation of the first counting circuit 240 and the second counting circuit 270 shown in FIG. 3 are the same.

Referring to FIG. 4A, the first counting circuit 240 includes a first counter 242 and a first comparator circuit 244a, and the second counting circuit 270 includes a second counter 272 and a second comparator circuit 274a.

Hereinafter, for simplicity, it is assumed that the first and second counters 242 and 272 are 4-bit counters, that the first reference count value RCNT1 is 4b'1000, that the second reference count value RCNT2 is 4b'1000, and that the first and second count values CNT1 and CNT2 are 4b'0000 at the beginning of operation.

FIG. 5 is a timing diagram of signals illustrating the operation of the PWM signal generation circuit shown in FIG. 3.

It is assumed that the output signals AOT1 and AOT2 of the first and second OP amps 210 and 250 are at the low level (L), and that the first and second comparison circuits 230 and 265 output discharging control signals CMP1 and CMP2 having low level (L), respectively.

Since the first OP amp 210 outputs the first charging control signal AOT1 having the low level L, each PMOS transistor PT1, PT2 is turned on to perform a charging operation on the first capacitor Ca. Since the first discharging switch SW1 is off according to the first discharging control signal CMP1 having the low level L, the charging operation is performed on the first capacitor Ca.

As the first capacitor Ca is charged, the voltage VND1 at the first node ND1 increases from 0 (zero) V.

As shown in (a) of FIG. 5, when the voltage VND1 at the first node ND1 is less than the second reference voltage VREF2 in the first charging time interval (or charging period) T1 for the first capacitor Ca, the first comparison circuit 230 outputs the first discharging control signal CMP1 having the low level L. The first discharging switch SW1 remains in the off state according to the first discharging control signal CMP1 having the low level L, and thus the first charging operation CP1_1 for the first capacitor Ca continues to be performed.

When the voltage VND1 at the first node ND1 is equal to the second reference voltage VREF2 or greater than the second reference voltage VREF2, the first comparison circuit 230 outputs the first discharging control signal CMP1 having the high level H for the first time. When the first discharging control signal CMP1 transitions or changes from the low level L to the high level H, the first discharging switch SW1 is turned on, and the voltage charged in the first capacitor Ca is discharged to the ground VSS through the first discharging switch SW1.

When the first discharging control signal CMP1 transitions to the high level H for the first time, the first counter 242 outputs the first count value CNT1 (e.g., 4b'0001). The first comparator circuit 244a compares the first count value CNT1 (4b'0001) with the first reference count value RCNT1 (4b'1000) bitwise, and outputs the first output signal OUT1 having the high level H when the first count value CNT1 (4b'0001) is less than the first reference count value RCNT1 (4b'1000).

When the voltage of the first capacitor Ca is discharged, the voltage VND1 at the first node ND1 is less than the second reference voltage VREF2, and therefore the first comparison circuit 230 outputs the first discharging control signal CMP1 having the low level L. Accordingly, the first discharging switch SW1 is turned off according to the first discharging control signal CMP1 having the low level L, and the second charging operation CP1_2 is performed on the first capacitor Ca.

When the voltage VND1 at the first node ND1 is equal to the second reference voltage VREF2 or greater than the second reference voltage VREF2 according to the second charging operation CP1_2 for the first capacitor Ca, the first comparison circuit 230 outputs the first discharging control signal CMP1 having the high level H for the second time. When the first discharging control signal CMP1 transitions to the high level H, the first discharging switch SW1 is turned on, and the voltage charged in the first capacitor Ca is discharged to ground VSS through the first discharging switch SW1.

When the first discharging control signal CMP1 transitions to the high level H for the second time, the first counter 242 outputs the first count value CNT1 (e.g., 4b'0010). The first comparator circuit 244a compares the first count value CNT1 (4b'0010) with the first reference count value RCNT1 (4b'1000) bitwise, and outputs the first output signal OUT1 having the high level H when the first count value CNT1 (4b'0010) is less than the first reference count value RCNT1 (4b'1000).

When the voltage of the first capacitor Ca is discharged, the voltage VND1 at the first node ND1 becomes lower than the second reference voltage VREF2, and thus the first comparison circuit 230 outputs the first discharging control signal CMP1 having the low level L. Therefore, the first discharging switch SW1 is turned off according to the first discharging control signal CMP1 having the low level L, and the third charging operation CP1_3 is performed on the first capacitor Ca.

In this way, when the first discharging control signal CMP1 transitions to the high level H for the seventh time, the first counter 242 outputs the first count value CNT1 (e.g., 4b'0111). The first comparator circuit 244a compares the first count value CNT1 (4b'0111) with the first reference count value RCNT1 (4b'1000) bitwise, and outputs the first output signal OUT1 having the high level H when the first count value CNT1 (4b'0111) is less than the first reference count value RCNT1 (4b'1000).

When the voltage of the first capacitor Ca is discharged, the voltage VND1 at the first node ND1 is less than the second reference voltage VREF2, and therefore the first comparison circuit 230 outputs the first discharging control signal CMP1 having the low level L. Accordingly, the first discharging switch SW1 is turned off according to the first discharging control signal CMP1 having the low level L, and the eighth charging operation CP1_n (where n is 8) is performed on the first capacitor Ca.

When the voltage VND1 at the first node ND1 is equal to the second reference voltage VREF2 or greater than the second reference voltage VREF2 according to the eighth charging operation CP1_8 for the first capacitor Ca, the first comparison circuit 230 outputs the first discharging control signal CMP1 having the high level H for the eighth time. When the first discharging control signal CMP1 transitions to the high level H, the first discharging switch SW1 is turned on, and the voltage of the first capacitor Ca is discharged through the first discharging switch SW1.

When the first discharging control signal CMP1 transitions to the high level H for the eighth time, the first counter 242 outputs the first count value CNT1 (e.g., 4b'1000). The first comparator circuit 244a compares the first count value CNT1 (4b'1000) with the first reference count value RCNT1 (4b'1000) bitwise, and outputs the first output signal OUT1 having the low level L only when the first count value CNT1 (4b'1000) reaches the first reference count value RCNT1 (4b'1000).

As shown in FIG. 5-(b), it is assumed that the pulse width control circuit 260 and the pulse period control circuit 220 operate simultaneously or in parallel.

Since the second OP amp 250 outputs the second charging control signal AOT2 having the low level L, each PMOS transistor PT3, PT4 is turned on to perform a charging operation on the second capacitor Cb. Since the second discharging switch SW2 is off according to the second discharging control signal CMP2 having the low level L, the charging operation is performed on the second capacitor Cb.

As the second capacitor Cb is charged, the voltage VND2 at the second node ND2 increases from 0 (zero) V.

When the voltage VND2 at the second node ND2 is less than the fourth reference voltage VREF4 in the second charging time interval (or charging period) T3 for the second capacitor Cb, the second comparison circuit 265 outputs the second discharging control signal CMP2 having the low level L. The second discharging switch SW2 remains in the off state according to the second discharging control signal CMP2 having the low level L, and thus the first charging operation CP2_1 for the second capacitor Cb continues to be performed.

When the voltage VND2 at the second node ND2 is equal to the fourth reference voltage VREF4 or greater than the fourth reference voltage VREF4, the second comparison circuit 265 outputs the second discharging control signal CMP2 having the high level H for the first time. When the second discharging control signal CMP2 transitions to the high level H, the second discharging switch SW2 is turned on, and the voltage charged in the second capacitor Cb is discharged to the ground VSS through the second discharging switch SW2.

When the second discharging control signal CMP2 transitions to the high level H for the first time, the second counter 272 outputs the second count value CNT2 (e.g., 4b'0001). The second comparator circuit 274a compares the second count value CNT2 (4b'0001) with the second reference count value RCNT2 (4b'1000) bitwise, and outputs the second output signal OUT2 having the high level H when the second count value CNT2 (4b'0001) is less than the second reference count value RCNT2 (4b'1000).

When the voltage of the second capacitor Cb is discharged, the voltage VND2 at the second node ND2 is less than the fourth reference voltage VREF4, and therefore the second comparison circuit 265 outputs the second discharging control signal CMP2 having the low level L. Accordingly, the second discharging switch SW2 is turned off according to the second discharging control signal CMP2 having the low level L, and the second charging operation CP2_2 is performed on the second capacitor Cb.

When the voltage VND2 at the second node ND2 is equal to the fourth reference voltage VREF4 or greater than the fourth reference voltage VREF4 according to the second charging operation CP2_2 for the second capacitor Cb, the second comparison circuit 265 outputs the second discharging control signal CMP2 having the high level H for the second time. When the second discharging control signal CMP2 transitions to the high level H, the second discharging switch SW2 is turned on, and the voltage charged in the second capacitor Cb is discharged to ground VSS through the second discharging switch SW2.

When the second discharging control signal CMP2 transitions to the high level H for the second time, the second counter 272 outputs the second count value CNT2 (e.g., 4b'0010). The second comparator circuit 274a compares the second count value CNT2 (4b'0010) with the second reference count value RCNT2 (4b'1000) bitwise, and outputs the second output signal OUT2 having the high level H when the second count value CNT2 (4b'0010) is less than the second reference count value RCNT2 (4b'1000).

When the voltage of the second capacitor Cb is discharged, the voltage VND2 at the second node ND2 is lower than the fourth reference voltage VREF4, and thus the second comparison circuit 265 outputs the second discharging control signal CMP2 having the low level L. Therefore, the second discharging switch SW2 is turned off according to the second discharging control signal CMP2 having the low level L, and the third charging operation CP2_3 is performed on the second capacitor Cb.

In this way, when the second discharging control signal CMP2 transitions to the high level H for the seventh time, the second counter 272 outputs the second count value CNT2 (e.g., 4b'0111). The second comparator circuit 274a compares the second count value CNT2 (4b'0111) with the second reference count value RCNT2 (4b'1000) bitwise, and outputs the second output signal OUT2 having the high level H when the second count value CNT2 (4b'0111) is less than the second reference count value RCNT2 (4b'1000).

When the voltage of the second capacitor Cb is discharged, the voltage VND2 at the second node ND2 is less than the fourth reference voltage VREF4, and therefore the second comparison circuit 265 outputs the second discharging control signal CMP2 having the low level L. Accordingly, the second discharging switch SW2 is turned off according to the second discharging control signal CMP2 having the low level L, and the eighth charging operation CP2_m (where m=8) is performed on the second capacitor Cb.

When the voltage VND2 at the second node ND2 is equal to the fourth reference voltage VREF4 or greater than the fourth reference voltage VREF4 according to the eighth charging operation CP2_8 for the second capacitor Cb, the second comparison circuit 265 outputs the second discharging control signal CMP2 having the high level H for the eighth time. When the second discharging control signal CMP2 transitions to the high level H, the second discharging switch SW2 is turned on, and the voltage of the second capacitor Cb is discharged through the second discharging switch SW2.

When the second discharging control signal CMP2 transitions to the high level H for the eighth time, the second counter 272 outputs the second count value CNT2 (e.g., 4b'1000). The second comparator circuit 274a compares the second count value CNT2 (4b'1000) with the second reference count value RCNT2 (4b'1000) bitwise, and outputs the second output signal OUT2 having the low level L only when the second count value CNT2 (4b'1000) reaches the second reference count value RCNT2 (4b'1000).

As described with reference to FIGS. 4A and 5-(b), whenever the first and second discharging control signals CMP1 and CMP2 transition to the high level H (or rising edge), the first and second counters 242 and 272 increment the first and second count values CNT1 and CNT2, respectively.

When the first and second count values CNT1 and CNT2 reach the first and second reference count values RCNT1 and RCNT2, respectively, the first and second comparator circuits 244a and 274a generate first and second output signals OUT1 and OUT2 having a specific level. In FIG. 5, the specific level is described as the low level L.

As shown in FIG. 5-(c), the control logic circuit 280 generates a reset signal RST that transitions from the high level H to the low level L at the moment when both the first and second output signals OUT1 and OUT2 reach the low level L. Therefore, the first and second counters 242 and 272 reset the first and second count values CNT1 and CNT2 to the initial value (e.g., 4b'0000) in response to the reset signal RST having the low level L.

As described with reference to FIGS. 5-(a) and 5-(b), the control logic circuit 280 generates and outputs a PWM signal SPWM having a period T2 and a pulse width T4 based on a change in level (or state) of the first output signal OUT1 and a change in level (or state) of the second output signal OUT2.

In one embodiment, the control logic circuit 280 may calculate the first charging time interval (or first charging period) T1 according to Equation 1 below, and may calculate the period T2 of the PWM signal SPWM related to the first output signal OUT1 according to Equation 2 below.

$$T1=R1*C1*(VREF2/VREF1) \qquad \text{[Equation 1]}$$

$$T2=T1*RNTI1 \qquad \text{[Equation 2]}$$

In Equation 1, R1 denotes the resistance of the first resistor Ra, C1 denotes the capacitance of the first capacitor Ca, VREF1 denotes the first reference voltage, and VREF2 denotes the second reference voltage. In Equation 2, RCNT1 denotes the first reference count value.

Also, the control logic circuit 280 may calculate the second charging time interval (or second charging period) T3 according to Equation 3 below, and may calculate the pulse width T4 of the PWM signal SPWM related to the second output signal OUT2 according to Equation 4 below.

$$T3=R2*C2*(VREF4/VREF3) \qquad \text{[Equation 3]}$$

$$T4=T3*RCNT2 \qquad \text{[Equation 4]}$$

In Equation 3, R2 denotes the resistance of the second resistor Rb, C2 denotes the capacitance of the second capacitor Cb, VREF3 denotes the third reference voltage, and VREF4 denotes the fourth reference voltage. In Equation 4, RCNT2 denotes the second reference count value.

The control logic circuit 280 may compute the frequency $f_{PWM}$ of the PWM signal SPWM according to Equation 5 below, and may compute the duty ratio DuR of the PWM signal SPWM according to Equation 6 below.

$$f_{PWM}=1/T2 \qquad \text{[Equation 5]}$$

$$DuR=T4/T2 \qquad \text{[Equation 6]}$$

Referring to FIG. 5-(c), the period of the PWM signal SPWM is defined as T2, and the pulse width of the PWM signal SPWM (also referred to as the high period or the on period) is defined as T4. In this case, the second reference voltage VREF2 and the fourth reference voltage VREF4 may be set such that T2=4.

Referring to Equations 1 to 4, since the period T2 of the PWM signal SPWM is affected by the resistance R1 of the first resistor Ra, and the pulse width T4 of the PWM signal SPWM is affected by the resistance R2 of the second resistor Rb, while the amount of change of each of the resistances R1 and R2 according to the change of the ambient temperature is the same, the change of the duty ratio DuR of the PWM signal SPWM according to the change of the ambient temperature is eliminated.

Figure 4B:
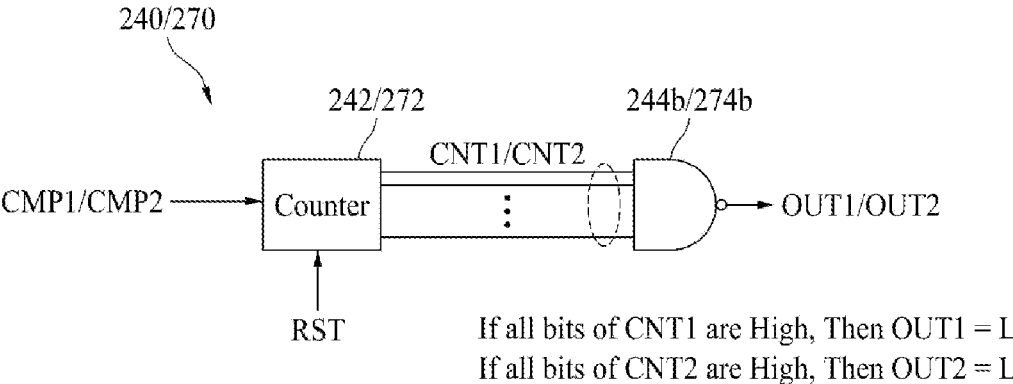

FIG. 4B is a block diagram according to another embodiment of the counting circuit shown in FIG. 3. The first and second counting circuits 240 and 270 shown in FIG. 3 have the same structure and operation. Referring to FIG. 4B, the first counting circuit 240 includes a first counter 242 and a first logic gate circuit 244b, and the second counting circuit 270 includes a second counter 272 and a second logic gate circuit 274b. In one embodiment, the first and second logic gate circuits 244b and 274b in FIG. 4B may be NAND gate circuits.

In FIG. 4B, it is assumed that the first and second counters 242 and 272 are 4-bit counters, the first reference count value is 4b'1111, the second reference count value is 4b'1111, and the first and second count values CNT1 and CNT2 are 4b'0000 at the beginning of operation.

When the first count value CNT1 of the first counter 242 reaches a first reference count value (4b'1111), that is, when the first count value CNT1 is 4b'1111, the first NAND gate circuit 244b outputs a first output signal OUT1 having the low level. Also, when the second count value CNT2 of the second counter 272 reaches a second reference count value (4b'1111), that is, when the second count value CNT2 is 4b'1111, the second NAND gate circuit 274b outputs a second output signal OUT2 having the low level.

In another embodiment, the first and second logic gate circuits 244b and 274b may be implemented as AND gate circuits. According to this embodiment, when the first count value CNT1 of the first counter 242 reaches the first reference count value (4b'1111), that is, when the first count value CNT1 is 4b'1111, the first AND gate circuit 244b outputs the first output signal OUT1 having the high level. Also, when the second count value CNT2 of the second counter 272 reaches the second reference count value (4b'1111), that is, when the second count value CNT2 is 4b'1111, the second AND gate circuit 274b outputs the second output signal OUT2 having the high level.

Figure 4C:
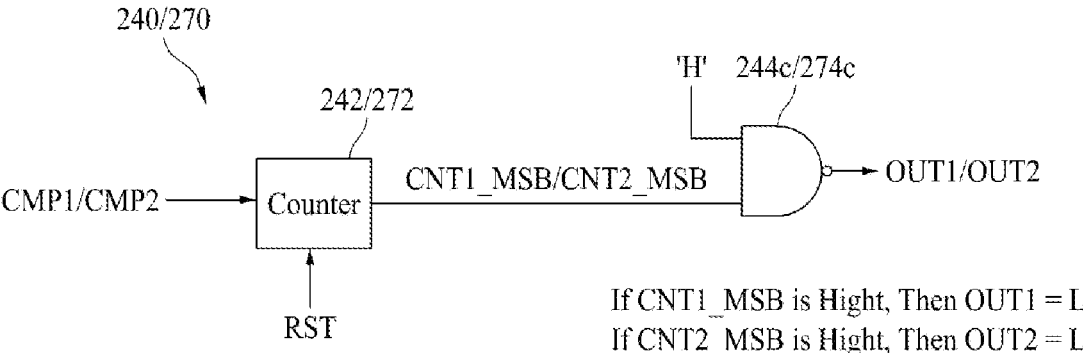

FIG. 4C is a block diagram according to another embodiment of the counting circuit shown in FIG. 3. The first and second counting circuits 240 and 270 shown in FIG. 3 have the same structure and operation. Referring to FIG. 4C, the first counting circuit 240 includes a first counter 242 and a first logic gate circuit 244C, and the second counting circuit 270 includes a second counter 272 and a second logic gate circuit 274C. In one embodiment, the first and second logic gate circuits 244c and 274c in FIG. 4C may be NAND gate circuits.

The first and second NAND gate circuits 244c and 274c may detect a transition of the most significant bits (MSBs) of the first and second count values CNT1 and CNT2 from the low level (logic 0 or data 0) to the high level (logic 1 or data 1) and generate the detection results OUT1 and OUT2.

In FIG. 4C, it is assumed that the first and second counters 242 and 272 are 4-bit counters, the first reference count value is 4b'1000, the second reference count value is 4b'1000, and each count value CNT1, CNT2 is 4b'0000 at the beginning of the operation.

When the first count value CNT1 of the first counter 242 reaches the first reference count value (4b'1000), that is, when the MSB (CNT1_MSB) of the first count value CNT1 changes from logic 0 to logic 1 (or at the moment when the MSB of the first count value CNT1 changes to logic 1), the first NAND gate circuit 244c outputs the first output signal OUT1 having the low level. Also, when the second count value CNT2 reaches the second reference count value (4b'1000), that is, when the MSB (CNT2_MSB) of the second count value CNT2 changes from logic 0 to logic 1 (or at the moment when the MSB changes to logic 1), the second NAND gate circuit 274c outputs the second output signal OUT2 having the low level.

In another embodiment, the first and second logic gate circuits 244c and 274c may be implemented as AND gate circuits. According to this embodiment, when the MSB (CNT1_MSB) of the first count value CNT1 changes from logic 0 to logic 1 (or at the moment when the MSB changes to logic 1), the first AND gate circuit 244c outputs the first output signal OUT1 having the high level. Also, when the MSB (CNT2_MSB) of the second count value (CNT2) changes from logic 0 to logic 1 (or at the moment when the MSB changes to logic 1), the second AND gate circuit 274c outputs the second output signal OUT2 having the high level.

Figure 4D:
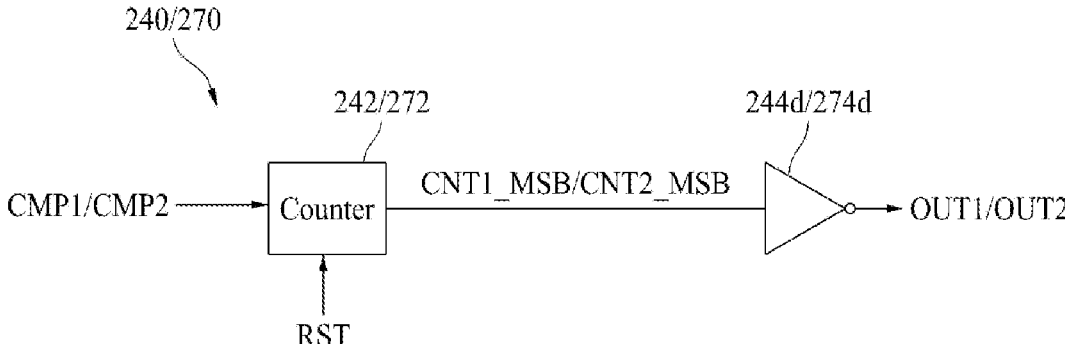

FIG. 4D is a block diagram according to another embodiment of the counting circuit shown in FIG. 3. The first and second counting circuits 240 and 270 shown in FIG. 3 have the same structure and operation. Referring to FIG. 4D, the first counting circuit 240 includes a first counter 242 and a first inverter 244d, and the second counting circuit 270 includes a second counter 272 and a second inverter 274d.

The first and second inverters 244d and 274d may detect a transition of the MSBs of the first and second count values CNT1 and CNT2 from logic 0 to logic 1 and generate the detection results OUT1 and OUT2.

In FIG. 4D, it is assumed that the first and second counters 242 and 272 are 4-bit counters, the first reference count value is 4b'1000, the second reference count value is 4b'1000, and each count value CNT1, CNT2 is 4b'0000 at the beginning of the operation.

When the first count value CNT1 reaches the first reference count value (4b'1000), that is, when the MSB (CNT1_MSB) of the first count value CNT1 changes from logic 0 to logic 1 (or at the moment when the MSB of the first count value CNT1 changes to logic 1), the first inverter 244d outputs the first output signal OUT1 having the low level. Also, when the second count value CNT2 of the second counter 272 reaches the second reference count value (4b'1000), that is, when the MSB (CNT2_MSB) of the second count value CNT2 changes from logic 0 to logic 1 (or at the moment when the MSB changes to logic 1), the second inverter 274d outputs the second output signal OUT2 having the low level.

In another embodiment, the first and second inverters 244d and 274d may be implemented as buffers. According to this embodiment, when the MSB (CNT1_MSB) of the first counter 242 changes from logic 0 to logic 1 (or at the moment when the MSB changes to logic 1), the first buffer 244d outputs the first output signal OUT1 having the high level. Also, when the MSB (CNT2_MSB) of the second counter 272 changes from logic 0 to logic 1 (or at the moment when the MSB changes to logic 1), the second buffer 274d outputs the second output signal OUT2 having the high level.

In another embodiment, the MSB (CNT1_MSB) of the first count value CNT1 may become the first output signal OUT1, and the MSB (CNT2_MSB) of the second count value CNT2 may become the second output signal OUT2. In this case, when the MSBs (CNT1_MSB, CNT2_MSB) of the first and second count values CNT1 and CNT2 change from logic 0 to logic 1, the first and second buffers 244d and 274d output the output signal OUT1 and OUT2 having the high level, respectively.

As described with reference to FIGS. 4A to 4D, the first reference count value and the second reference count value may be set equal to each other or may be set different from each other.

Figure 6:
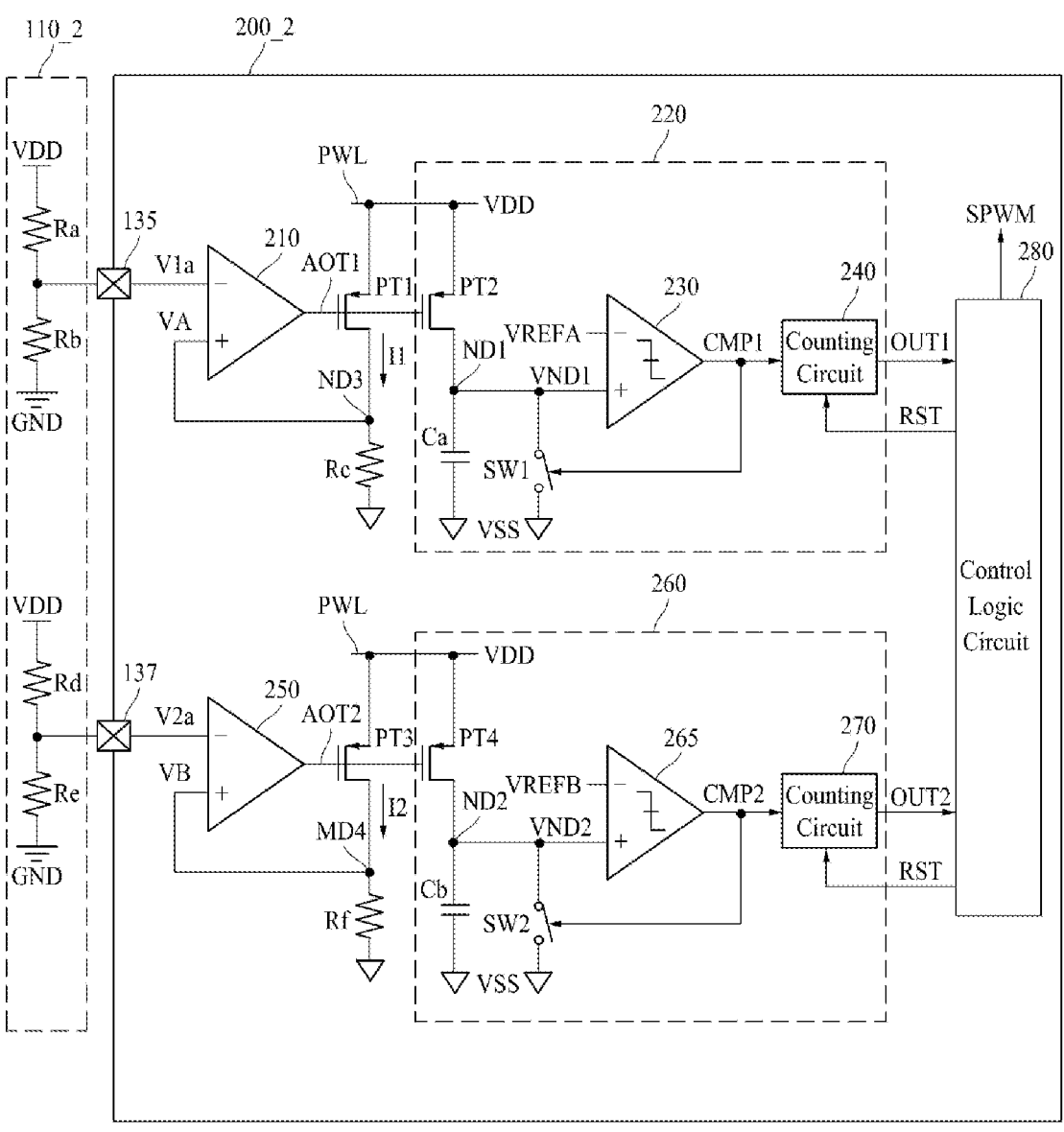
FIG. 6 is a block diagram of a PWM signal generation circuit according to another embodiment of the present disclosure.

FIG. 6 is a block diagram of a PWM signal generation circuit according to another embodiment of the present disclosure.

For simplicity, FIG. 6 illustrates and describes a regulation circuit 110_2 including resistors Ra, Rb, Rd, and Re and a PWM signal generation circuit 200_2. The regulation circuit 110_2 and PWM signal generation circuit 200_2 shown in FIG. 6 may be another example of the regulation circuit 110 and PWM signal generation circuit 200 shown in FIG. 1.

The first resistor Ra is connected between the voltage line supplying the operating voltage VDD and the third pin 135, the second resistor Rb is connected between the third pin 135 and the ground GND, the third resistor Rd is connected between the voltage line and the fourth pin 137, and the fourth resistor Re is connected between the fourth pin 137 and the ground GND.

The PWM signal generation circuit 200_2 includes the third pin 135, the fourth pin 137, a first OP amp 210, a first current supply circuit PT1, a first internal resistor Rc, a pulse period control circuit 220, a second OP amp 250, a second current supply circuit PT3, a second internal resistor Rf, a pulse width control circuit 260, and a control logic circuit 280.

In FIG. 6, the first resistor Ra, the second resistor Rb, the first OP amp 210, and the first current supply circuit PT1 may constitute a first voltage-to-current converter, and the third resistor Rd, the fourth resistor Re, the second OP amp 250, and the second current supply circuit PT3 may constitute a second voltage-to-current converter. The operation of the first and second voltage-to-current converters is similar to that described with reference to FIG. 3, and thus a detailed description thereof will be omitted.

The first OP amp 210 includes an inverting input terminal connected to the third pin 135, a non-inverting input terminal connected to the third node ND3, and an output terminal configured to output a first charging control signal AOT1. The first OP amp 210 amplifies the difference between the voltage V1a of the third pin 135 and the voltage VA to the non-inverting input terminal, and outputs the result (AOT1) to the gates of the first current supply circuit PT1 and the first charging control circuit PT2 through the output terminal, respectively. In this case, the first current supply circuit PT1 and the first charging control circuit PT2 may be implemented as PMOS transistors. The voltage V1a of the third pin 135 may be determined according to the voltage distribution to the resistors Ra and Rb.

The first current supply circuit PT1 is connected between the voltage line PWL supplying the operating voltage VDD and the third node ND3, and the first current I1 flowing in the first current supply circuit PT1 may be defined by the operating voltage VDD and the resistors Ra, Rb, and Rc.

When the voltage VA to the non-inverting input terminal is less than the voltage V1a of the third pin 135, the first OP amp 210 generates a first charging control signal AOT1 having the low level L, and thus the PMOS transistors PT1 and PT2 remain on.

However, when the voltage VA to the non-inverting input terminal becomes greater than or equal to the voltage V1a of the third pin 135, the first OP amp 210 generates the first charging control signal AOT1 having the high level H, and thus the PMOS transistors PT1 and PT2 are turned off. Accordingly, the pulse period control circuit 220 does not perform the charging operation.

The second OP amp 250 includes an inverting input terminal connected to the fourth pin 137, a non-inverting input terminal connected to the fourth node ND4, and an output terminal configured to output the second charging control signal AOT2. The second OP amp 250 amplifies the difference between the voltage V2a of the fourth pin 137 and the voltage VB to the non-inverting input terminal, and outputs the result (AOT2) to the gates of the second current supply circuit PT3 and the second charging control circuit PT4 via the output terminal. In this case, the second current supply circuit PT3 and the second charging control circuit PT4 may be implemented as PMOS transistors. The voltage V2a of the fourth pin 137 may be determined by the voltage distribution to the resistors Rd and Re.

The second current supply circuit PT3 is connected between the voltage line PWL supplying the operating voltage VDD and the fourth node ND4, and the second current I2 flowing in the second current supply circuit PT3 is defined by the operating voltage VDD and the resistors Rd, Re, and Rf.

When the voltage VB to the non-inverting input terminal is lower than the voltage V2a of the fourth pin 137, the second OP amp 250 generates the second charging control signal AOT2 having a low level (L), and thus the PMOS transistors PT3 and PT4 remain on.

However, when the voltage VB to the non-inverting input terminal becomes greater than or equal to the voltage V2a of the fourth pin 137, the second OP amp 250 generates the second charging control signal AOT2 having the high level H, and thus the PMOS transistors PT3 and PT4 are turned off. Accordingly, the pulse width control circuit 260 does not perform the charging operation.

As shown in FIG. 6, a first reference voltage VREFA is supplied to the inverting input terminal of the first comparison circuit 230, and a second reference voltage VREFB is supplied to the inverting input terminal of the second comparison circuit 265.

FIG. 7 is a timing diagram of signals illustrating the operation of the PWM signal generation circuit shown in FIG. 6.

Referring to FIGS. 4A to 4D, 6, and 7, it is assumed that the first and second output signals AOT1 and AOT2 of the first and second OP amps 210 and 250 are at the low level L, and the first and second comparison circuits 230 and 265 output the first and second discharging control signals CMP1 and CMP2 having the low level L.

As previously assumed, the first reference count value is RCNT1 (4b'1000) in FIG. 4A, 4b'1111 in FIG. 4B, 4b'1000 in FIG. 4C, and 4b'1000 in FIG. 4D.

For simplicity in the following description, it is assumed that the first and second counting circuits 240 and 270 of FIG. 6 are the first and second counting circuits illustrated in FIG. 4A, but the technical ideas of the present disclosure may also be applicable when the first and second counting circuits 240 and 270 of FIG. 6 are implemented as the first and second counting circuits illustrated in FIG. 4B, 4C, or 4D.

Since the first OP amp 210 outputs the first charging control signal AOT1 having the low level L, each PMOS transistor PT1, PT2 is turned on. Since a corresponding current flows in the second PMOS transistor PT2 and the first discharging switch SW1 is in the off state, a charging operation is performed on the first capacitor Ca.

As the first capacitor Ca is charged, the voltage VND1 at the first node ND1 increases from 0 (zero) V.

Referring to FIGS. 6 and 7-(a), when the voltage VND1 at the first node ND1 is less than the first reference voltage VREFA in the first charging time interval T1 for the first capacitor Ca, the first comparison circuit 230 outputs the first discharging control signal CMP1 having the low level L. At this time, the first discharging switch SW1 remains in the off state according to the first discharging control signal CMP1 having the low level L, and thus the first charging operation CP1_1 for the first capacitor Ca continues to be performed.

When the voltage VND1 at the first node ND1 is equal to the first reference voltage VREFA or greater than the first reference voltage VREFA, the first comparison circuit 230 outputs the first discharging control signal CMP1 having the high level H for the first time. When the first discharging control signal CMP1 transitions from the low level L to the high level H, the first discharging switch SW1 is turned on, and the voltage charged in the first capacitor Ca is discharged to the ground VSS through the first discharging switch SW1.

When the first discharging control signal CMP1 transitions to the high level H for the first time, the first counter 242 outputs the first count value CNT1 (4b'0001). When the first count value CNT1 (4b'0001) has not reached the first reference count value RCNT1 (4b'1000), for example, when the first count value CNT1 (4b'0001) is less than the first reference count value RCNT1 (4b'1000), the first comparator circuit 244a outputs the first output signal OUT1 having the high level H.

When the voltage of the first capacitor Ca is discharged, the voltage VND1 at the first node ND1 is less than the first reference voltage VREFA, and therefore the first comparison circuit 230 outputs the first discharging control signal CMP1 having the low level L. Accordingly, the first discharging switch SW1 is turned off according to the first discharging control signal CMP1 having the low level L, and the second charging operation CP1_2 is performed on the first capacitor Ca.

The second to seventh charging operations CP1_2 to CP1_7 and the discharging operations related thereto are the same as the first charging operation CP1_1 and the discharging operation related thereto, and thus a detailed description thereof is omitted.

In the same manner as the first charging operation CP1_1 and the discharging operation related thereto, when the first discharging control signal CMP1 transitions to the high level H for the seventh time, the first counter 242 outputs the first count value CNT1 (e.g., 4b'0111). The first comparator circuit 244a determines whether the first count value CNT1 (4b'0111) has reached the first reference count value RCNT1 (4b'1000), and outputs the first output signal OUT1 having the high level H when the first count value CNT1 (4b'0111) has not reached the first reference count value RCNT1 (4b'1000).

When the voltage of the first capacitor Ca is discharged, the voltage VND1 at the first node ND1 is less than the first reference voltage VREFA, and therefore the first comparison circuit 230 outputs the first discharging control signal CMP1 having the low level L. Accordingly, the first discharging switch SW1 is turned off according to the first discharging control signal CMP1 having the low level L, and the eighth charging operation CP1_n (where n is 8) is performed on the first capacitor Ca.

When the voltage VND1 at the first node ND1 is equal to the first reference voltage VREFA or greater than the first reference voltage VREFA according to the eighth charging operation CP1_8 for the first capacitor Ca, the first comparison circuit 230 outputs the first discharging control signal CMP1 having the high level H for the eighth time. When the first discharging control signal CMP1 transitions to the high level H, the first discharging switch SW1 is turned on, and the voltage of the first capacitor Ca is discharged through the first discharging switch SW1.

When the first discharging control signal CMP1 transitions to the high level H for the eighth time, the first counter 242 outputs the first count value CNT1 (e.g., 4b'1000). The first comparator circuit 244a outputs the first output signal OUT1 having the low level L only when the first count value CNT1 (4b'1000) reaches the first reference count value RCNT1 (4b'1000).

As shown in FIG. 7-(b), it is assumed that the pulse width control circuit 260 and the pulse period control circuit 220 operate simultaneously or in parallel.

Since the second OP amp 250 outputs the second charging control signal AOT2 having the low level L, each PMOS transistor PT3, PT4 is turned on. Since a corresponding current flows in the fourth PMOS transistor PT4 and the second discharging switch SW2 is in the off state, the charging operation is performed on the second capacitor Cb.

As the second capacitor Cb is charged, the voltage VND2 at the second node ND2 increases from 0 (zero) V.

Referring to FIGS. 6 and 7-(b), when the voltage VND2 at the second node ND2 is less than the second reference voltage VREFB in the second charging time interval T3 for the second capacitor Cb, the second comparison circuit 265 outputs the second discharging control signal CMP2 having the low level L. The second discharging switch SW2 remains in the off state according to the second discharging control signal CMP2 having the low level L, and thus the first charging operation CP2_1 for the second capacitor Cb continues to be performed.

When the voltage VND2 at the second node ND2 is equal to the second reference voltage VREFB or greater than the second reference voltage VREFB, the second comparison circuit 265 outputs the second discharging control signal CMP2 having the high level H for the first time. When the second discharging control signal CMP2 transitions from the low level L to the high level H, the second discharging switch SW2 is turned on, and the voltage charged in the second capacitor Cb is discharged through the second discharging switch SW2.

When the second discharging control signal CMP2 transitions to the high level H for the first time, the second counter 272 outputs the second count value CNT2 (e.g., 4b'0001). The second comparator circuit 274a compares the second count value CNT2 (4b'0001) with the second reference count value RCNT2 (4b'1000), and outputs the second output signal OUT2 having the high level H because the second count value CNT2 (4b'0001) has not reached the second reference count value RCNT2 (4b'1000).

When the voltage of the second capacitor Cb is discharged, the voltage VND2 at the second node ND2 is less than the second reference voltage VREFB, and therefore the second comparison circuit 265 outputs the second discharging control signal CMP2 having the low level L. Accordingly, the second discharging switch SW2 is turned off according to the second discharging control signal CMP2 having the low level L, and the second charging operation CP2_2 is performed on the second capacitor Cb.

The second to seventh charging operations CP2_2 to CP2_7 and the discharging operations related thereto are the same as the first charging operation CP2_1 and the discharging operation related thereto, and thus a detailed description thereof is omitted.

In the same manner as the first charging operation CP2_1 and the discharging operation related thereto, when the second discharging control signal CMP2 transitions to the high level H for the seventh time, the second counter 272 outputs the second count value CNT2 (e.g., 4b'0111). The second comparator circuit 274a determines whether the second count value CNT2 (4b'0111) has reached the second reference count value RCNT2 (4b'1000), and outputs the second output signal OUT2 having the high level H because the second count value CNT2 (4b'0111) has not reached the second reference count value RCNT2 (4b'1000).

When the voltage of the second capacitor Cb is discharged, the voltage VND2 at the second node ND2 is less than the second reference voltage VREFB, and therefore the second comparison circuit 265 outputs the second discharging control signal CMP2 having the low level L. Accordingly, the second discharging switch SW2 is turned off according to the second discharging control signal CMP2 having the low level L, and the eighth charging operation CP2_m (where m=8) is performed on the second capacitor Cb.

When the voltage VND2 at the second node ND2 is equal to the second reference voltage VREFB or greater than the second reference voltage VREFB according to the eighth charging operation CP2_8 for the second capacitor Cb, the second comparison circuit 265 outputs the second discharging control signal CMP2 having the high level H for the eighth time. When the second discharging control signal CMP2 transitions to the high level H, the second discharging switch SW2 is turned on, and the voltage of the second capacitor Cb is discharged through the second discharging switch SW2.

When the second discharging control signal CMP2 transitions to the high level H for the eighth time, the second counter 272 outputs the second count value CNT2 (e.g., 4b'1000). The second comparator circuit 274a outputs the second output signal OUT2 having the low level L only when the second count value CNT2 (4b'1000) reaches the first reference count value RCNT1 (4b'1000).

As described with reference to FIGS. 6 and 7-(*b*), whenever the first and second discharging control signals CMP1 and CMP2 transition to the high level H, the first and second counters 242 and 272 increment the first and second count values CNT1 and CNT2, respectively.

When the first and second count values CNT1 and CNT2 reach the first and second reference count values RCNT1 and RCNT2, respectively, namely, when the first and second count values CNT1 and CNT2 are equal to the first and second reference count values RCNT1 and RCNT2, respectively, the first and second comparator circuits 244a and 274a generate first and second output signals OUT1 and OUT2 having a specific level, respectively. In FIG. 7-(*c*), the specific level is described as the low level L.

As shown in FIG. 7-(*c*), the control logic circuit 280 generates a reset signal RST that transitions from the high level H to the low level L at the moment when both the first and second output signals OUT1 and OUT2 reach the low level L. Therefore, the first and second counters 242 and 272 reset the first and second count values CNT1 and CNT2 to the initial value in response to the reset signal RST having the low level L.

The control logic circuit 280 generates a PWM signal SPWM based on a change in level of the first output signal OUT1 and a change in level of the second output signal OUT2, and outputs the same to the current control circuit 300 of FIG. 1.

In one embodiment, the control logic circuit 280 may calculate the first charging time interval (or first charging period) T1 according to Equation 7 below, and may calculate the period T2 of the PWM signal SPWM related to the first output signal OUT1 according to Equation 8 below.

$$T1=R3*(R1+R2)*C1*VREFA/(R2*VDD) \qquad \text{[Equation 7]}$$

$$T2=T1*RCNT1 \qquad \text{[Equation 8]}$$

In Equation 7, R1 denotes the resistance of the first resistor Ra, R2 denotes the resistance of the second resistor Rb, R3 denotes the resistance of the first internal resistor Rc, C1 denotes the capacitance of the first capacitor Ca, VREFA denotes the first reference voltage, and VDD denotes the operating voltage. In Equation 8, RCNT1 denotes the first reference count value.

Also, the control logic circuit 280 may calculate the second charging time interval (or second charging time) T3 according to Equation 9 below, and may calculate the pulse width T4 of the PWM signal SPWM related to the second output signal OUT2 according to Equation 10 below.

$$T3=R6*(R4+R5)*C2*VREFB/(R5*VDD) \qquad \text{[Equation 9]}$$

$$T4=T3*RCNT2 \qquad \text{[Equation 10]}$$

In Equation 9, R4 denotes the resistance of the third resistor Rd, R5 denotes the resistance of the fourth resistor Re, R6 denotes the resistance of the second internal resistor Rf, C2 denotes the capacitance of the second capacitor Cb, and VREFB denotes the second reference voltage. In Equation 10, RCNT2 denotes the second reference count value.

The control logic circuit 280 may compute the frequency $f_{PWM}$ of the PWM signal SPWM according to Equation 11 below, and may compute the duty ratio DuR of the PWM signal SPWM according to Equation 12 below.

$$f_{PWM}=1/T2 \qquad \text{[Equation 11]}$$

$$DuR=T4/T2 \qquad \text{[Equation 12]}$$

Referring to FIG. 7-(*c*), the period of the PWM signal SPWM is defined as T2, and the pulse width of the PWM signal SPWM is defined as T4. In this case, the first reference voltage VREFA and the second reference voltage VREFB may be set such that T2=4.

Referring to Equations 7 to 10, since the period T2 of the PWM signal SPWM is affected by the resistances R1 and R2 of the resistors Ra and Rb, and the pulse width T4 of the PWM signal SPWM is affected by the resistances R4 and R5 of the resistors Rd and Re, while the amount of change of each of the resistances R1, R2, R4, and R5 according to the change of the ambient temperature is the same, the change of the duty ratio DuR of the PWM signal SPWM according to the change of the ambient temperature is eliminated.

Figure 8:
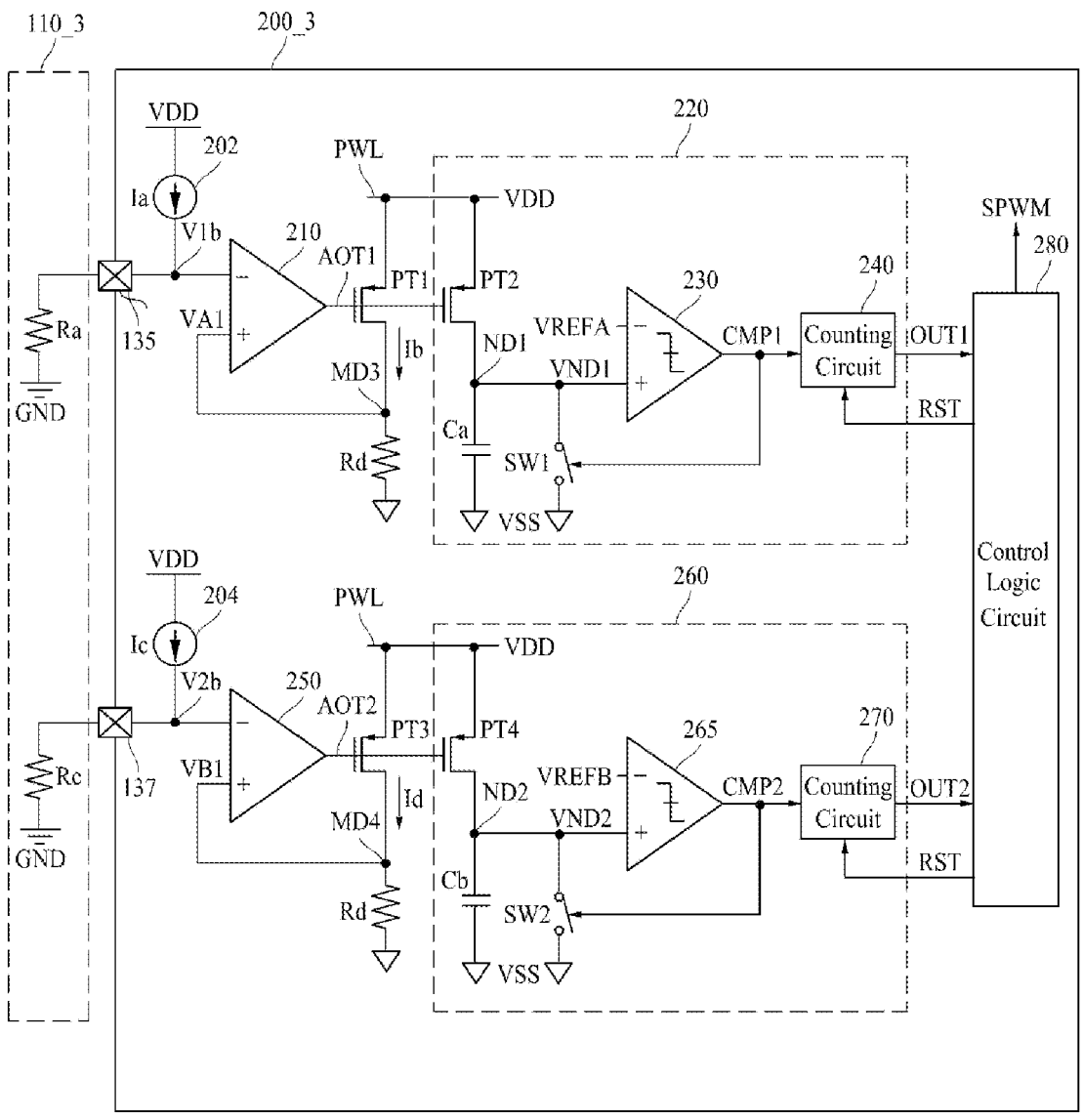
FIG. 8 is a block diagram of a PWM signal generation circuit according to another embodiment of the present disclosure.

FIG. 8 is a block diagram of a PWM signal generation circuit according to another embodiment of the present disclosure.

For simplicity, FIG. 8 illustrates and describes a regulation circuit 110_3 including resistors Ra and Rc and a PWM signal generation circuit 200_3. The regulation circuit 110_3 and PWM signal generation circuit 200_3 shown in FIG. 8 may be another example of the regulation circuit 110 and PWM signal generation circuit 200 shown in FIG. 1.

The first resistor Ra is connected between the third pin 135 and the ground GND, and the second resistor Rc is connected between the fourth pin 137 and the ground GND.

The PWM signal generation circuit 200_2 includes the third pin 135, the fourth pin 137, a first constant current source 202, a first OP amp 210, a first internal resistor Rb, a first current supply circuit PT1, a pulse period control circuit 220, a second constant current source 204, a second OP amp 250, a second internal resistor Rd, a second current supply circuit PT3, a pulse width control circuit 260, and a control logic circuit 280.

In FIG. 8, the first resistor Ra, the first OP amp 210, and the first current supply circuit PT1 may constitute a first voltage-to-current converter, and the second resistor Rc, the second OP amp 250, and the second current supply circuit PT3 may constitute a second voltage-to-current converter.

The first constant current source 202 is connected between the voltage line PWL supplying the operating voltage VDD and the third pin 135, and supplies a first current Ia to the third pin 135.

The first OP amp 210 includes an inverting input terminal connected to the third pin 135, a non-inverting input terminal connected to the third node ND3, and an output terminal configured to output a first charging control signal AOT1. The first OP amp 210 amplifies the difference between the voltage V1*b* of the third pin 135 and the voltage VA1 to the non-inverting input terminal, and outputs the result (AOT1) to the gates of the first current supply circuit PT1 and the first charging control circuit PT2 through the output terminal, respectively. In this case, the first current supply circuit PT1 and the first charging control circuit PT2 may be implemented as PMOS transistors.

The first current supply circuit PT1 is connected between the voltage line PWL supplying the operating voltage VDD and the third node ND3, and the second current Ib flowing in the first current supply circuit PT1 may be defined by the operating voltage VDD, the first resistor Ra, and the first current Ia.

When the voltage VA1 to the non-inverting input terminal is less than the voltage V1*b* of the third pin 135, the first OP amp 210 generates a first charging control signal AOT1 having the low level L, and thus the PMOS transistors PT1 and PT2 remain on.

However, when the voltage VA1 to the non-inverting input terminal becomes greater than or equal to the voltage V1$b$ of the third pin 135, the first OP amp 210 generates the first charging control signal AOT1 having the high level H, and thus the PMOS transistors PT1 and PT2 are turned off. Accordingly, the pulse period control circuit 220 does not perform the charging operation.

The second constant current source 204 is connected between the voltage line PWL supplying the operating voltage VDD and the fourth pin 137, and supplies a third current Ic to the fourth pin 137.

The second OP amp 250 includes an inverting input terminal connected to the fourth pin 137, a non-inverting input terminal connected to the fourth node ND4, and an output terminal configured to output the second charging control signal AOT2. The second OP amp 250 amplifies the difference between the voltage V2$b$ of the fourth pin 137 and the voltage VB1 to the non-inverting input terminal, and outputs the result (AOT2) to the gates of the second current supply circuit PT3 and the second charging control circuit PT4 via the output terminal. In this case, the second current supply circuit PT3 and the second charging control circuit PT4 may be implemented as PMOS transistors.

The second current supply circuit PT3 is connected between the voltage line PWL supplying the operating voltage VDD and the fourth node ND4, and the fourth current Id flowing in the second current supply circuit PT3 may be defined by the operating voltage VDD, the second resistor Rc, and the third current Ic.

When the voltage VB1 to the non-inverting input terminal is lower than the voltage V2$b$ of the fourth pin 137, the second OP amp 250 generates the second charging control signal AOT2 having the low level L, and thus the PMOS transistors PT3 and PT4 remain on.

However, when the voltage VB1 to the non-inverting input terminal becomes greater than or equal to the voltage V2$b$ of the fourth pin 137, the second OP amp 250 generates the second charging control signal AOT2 having the high level H, and thus the PMOS transistors PT3 and PT4 are turned off. Accordingly, the pulse width control circuit 260 does not perform the charging operation.

As shown in FIG. 8, a first reference voltage VREFA is supplied to the inverting input terminal of the first comparison circuit 230, and a second reference voltage VREFB is supplied to the inverting input terminal of the second comparison circuit 265.

The operations of the PWM signal generation circuit 200_3 shown in FIG. 8 are similar to the operations of the PWM signal generation circuit 200_2 shown in FIG. 7, and thus a detailed description thereof is omitted.

In one embodiment, referring to FIGS. 7 and 8, the control logic circuit 280 may calculate the first charging time interval T1 according to Equation 13 below, and may calculate the period T2 of the PWM signal SPWM related to the first output signal OUT1 according to Equation 14 below.

$$T1=R2*C1*VREFA/(R1*Ia) \qquad \text{[Equation 13]}$$

In Equation 13, R1 denotes the resistance of the first resistor Ra of FIG. 8, R2 denotes the resistance of the first internal resistor Rb of FIG. 8, C1 denotes the capacitance of the first capacitor Ca of FIG. 8, VREFA denotes the first reference voltage, and Ia denotes the amount of current flowing in the first constant current source 202.

$$t2=T1*RCNT1 \qquad \text{[Equation 14]}$$

Also, the control logic circuit 280 may calculate the second charging time interval T3 according to Equation 15 below, and may calculate the pulse width T4 of the PWM signal SPWM related to the second output signal OUT2 according to Equation 16 below. In Equation 14, RCNT1 denotes the first reference count value.

$$T3=R4*C2*VREFB/(R3*Ic) \qquad \text{[Equation 15]}$$

$$T4=T3*RCNT2 \qquad \text{[Equation 16]}$$

In Equation 15, R3 denotes the resistance of the second resistor Rc of FIG. 8, R4 denotes the resistance of the second internal resistor Rd of FIG. 8, C2 denotes the capacitance of the second capacitor Cb, VREFB denotes the second reference voltage, and Ic denotes the amount of current flowing in the second constant current source 204. In Equation 16, RCNT2 denotes the second reference count value.

The control logic circuit 280 may compute the frequency $f_{PWM}$ of the PWM signal SPWM according to Equation 17 below, and may compute the duty ratio DuR of the PWM signal SPWM according to Equation 18 below.

$$f_{PWM}=1/T2 \qquad \text{[Equation 17]}$$

$$DuR=T4/T2 \qquad \text{[Equation 18]}$$

Referring to Equations 13 to 16, since the period T2 of the PWM signal SPWM is affected by the resistance R1 of the resistor Ra, and the pulse width T4 of the PWM signal SPWM is affected by the resistance R3 of the resistor Rc, while the amount of change of each of the resistances R1 and R3 according to the change of the ambient temperature is the same, the change of the duty ratio DuR according to the change of the ambient temperature is eliminated.

As is apparent from the above description, the present disclosure has the following effects.

According to the present disclosure, a pulse width modulation signal generation circuit capable of adjusting a frequency and a duty ratio may generate a PWM signal whose duty ratio remains constant even when the ambient temperature changes.

Furthermore, according to the present disclosure, a pulse width modulation signal generation circuit capable of adjusting a frequency and a duty ratio may improve a nonlinearity of a discharge voltage affecting a PWM signal.

It will be appreciated by those skilled in the art to which the present disclosure belongs that the disclosure described above can be practiced in other specific forms without altering its technical ideas or essential features.

It should therefore be understood that the embodiments described above are exemplary and non-limiting in all respects. The scope of the present disclosure is defined by the appended claims, rather than by the detailed description above, and should be construed to cover all modifications or variations derived from the meaning and scope of the appended claims and the equivalents thereof.

What is claimed is:

1. A pulse width modulation (PWM) signal generation circuit comprising:

a pulse period control circuit configured to:

control charging and discharging of a first capacitor; and generate a first output signal related to a first number of times of charging of the first capacitor;

a pulse width control circuit configured to:

control charging and discharging of a second capacitor; and generate a second output signal related to a second number of times of charging of the second capacitor;

a control logic circuit configured to:

determine a period of a PWM signal based on the first output signal;

determine a pulse width of the PWM signal based on the second output signal; and output the PWM signal having the period and the pulse width, a first amplifier configured to amplify a difference between a third reference voltage applied to an inverting terminal and a voltage applied to a non-inverting terminal to generate a first charging control signal for the charging of the first capacitor; and a first current supply circuit configured to generate a first current in response to the first charging control signal and feed the first current back to the non-inverting terminal.

2. The PWM signal generation circuit of claim 1, wherein the pulse period control circuit comprises:

a first charging control circuit configured to control the charging of the first capacitor in response to the first charging control signal;

a first comparison circuit configured to compare a first reference voltage with a first charging voltage of the first capacitor to generate a first discharging control signal;

a first discharging switch configured to control the discharging of the first capacitor in response to the first discharging control signal; and a first counting circuit configured to:

count the number of changes in state of the first discharging control signal to generate a first count value corresponding to the first number of times of charging; and generate the first output signal having a first state when the first count value reaches a first reference count value, wherein the period of the PWM signal is determined by a product of a first charging period for the first capacitor and the first reference count value.

3. The PWM signal generation circuit of claim 1, wherein the first current fed back to the non-inverting terminal is regulated by a first resistor connected between the non-inverting terminal and a ground.

4. The PWM signal generation circuit of claim 2, further comprising:

a third resistor connected between the non-inverting terminal and a ground, wherein the first current fed back to the non-inverting terminal is regulated by a first resistor circuit connected to the inverting terminal.

5. The PWM signal generation circuit of claim 2, further comprising:

a first current source configured to supply a first current to the inverting terminal; and a second resistor connected between the non-inverting terminal and a ground, wherein the first current supply circuit is configured to generate a second current in response to the first charging control signal and feed the second current back to the non-inverting terminal; and wherein the second current fed back to the non-inverting terminal is regulated by a first resistor connected between the inverting terminal and the ground.

6. The PWM signal generation circuit of claim 1, wherein the pulse width control circuit comprises:

a second charging control circuit configured to control the charging of the second capacitor in response to a second charging control signal;

a second comparison circuit configured to compare a second reference voltage with a second charging voltage of the second capacitor to generate a second discharging control signal;

a second discharging switch configured to control the discharging of the second capacitor in response to the second discharging control signal;

a second counting circuit configured to:

count the number of changes in state of the second discharging control signal to generate a second count value corresponding to the second number of times of charging; and generate the second output signal having a first state when the second count value reaches a second reference count value, a second amplifier configured to amplify a difference between a fourth reference voltage applied to the inverting terminal and the voltage applied to the non-inverting terminal to generate the second charging control signal for the charging of the second capacitor; and a second current supply circuit configured to generate a second current in response to the second charging control signal and feed the second current back to the non-inverting terminal, wherein the pulse width of the PWM signal is determined by a product of a second charging period for the second capacitor and the second reference count value, and wherein the second current fed back to the non-inverting terminal is regulated by a second resistor connected between the non-inverting terminal and a ground.

7. The PWM signal generation circuit of claim 6, further comprising:

a sixth resistor connected between the non-inverting terminal and the ground, wherein the second amplifier is configured to amplify a difference between a voltage applied to the inverting terminal and the voltage applied to the non-inverting terminal to generate the second charging control signal for the charging of the second capacitor; and wherein the second current fed back to the non-inverting terminal is regulated by the second resistor circuit connected to the inverting terminal.

8. The PWM signal generation circuit of claim 6, further comprising:

a second current source configured to supply a third current to the inverting terminal; and a fourth resistor connected between the non-inverting terminal and the ground, wherein the second amplifier is configured to amplify a difference between a voltage applied to the inverting terminal and the voltage applied to the non-inverting terminal to generate the second charging control signal for the charging of the second capacitor; and the second current supply circuit is configured to generate a fourth current in response to the second charging control signal and feed the fourth current back to the non-inverting terminal; and wherein the fourth current fed back to the non-inverting terminal is regulated by a third resistor connected between the inverting terminal and the ground.

* * * * *